(12) United States Patent
Richards et al.

(10) Patent No.: US 7,453,187 B2
(45) Date of Patent: Nov. 18, 2008

(54) PIEZOELECTRIC MICRO-TRANSDUCERS, METHODS OF USE AND MANUFACTURING METHODS FOR SAME

(75) Inventors: Robert F. Richards, Pullman, WA (US); David F. Bahr, Pullman, WA (US); Cecilia Richards, Pullman, WA (US)

(73) Assignee: Washington State University Research Foundation, Pullman, WA (US)

( * ) Notice: Subject to any disclaimer, the term of this patent is extended or adjusted under 35 U.S.C. 154(b) by 469 days.

(21) Appl. No.: 11/147,031

(22) Filed: Jun. 7, 2005

(65) Prior Publication Data

US 2005/0225213 A1 Oct. 13, 2005

Related U.S. Application Data

(62) Division of application No. 10/033,353, filed on Oct. 25, 2001, now Pat. No. 7,235,914.

(60) Provisional application No. 60/243,447, filed on Oct. 25, 2000.

(51) Int. Cl.
*H01L 41/113* (2006.01)
(52) U.S. Cl. ...................................... 310/339
(58) Field of Classification Search ................... 310/339
See application file for complete search history.

(56) References Cited

U.S. PATENT DOCUMENTS

| | | | |
|---|---|---|---|
| 2,522,389 A | 9/1950 | Mason | |
| 3,234,413 A * | 2/1966 | Schwartz et al. | ............ 310/328 |
| 3,456,134 A | 7/1969 | Ko | |
| 3,519,067 A | 7/1970 | Schmidt | |
| 3,643,734 A | 2/1972 | Deschamps | |
| 4,005,319 A * | 1/1977 | Nilsson et al. | ............... 310/339 |

(Continued)

FOREIGN PATENT DOCUMENTS

EP 0 725 452 A1 8/1996

(Continued)

OTHER PUBLICATIONS

"Micro Supplies to Power MEMs Devices", *IEEE Spectrum*, (Sep. 2001).

(Continued)

*Primary Examiner*—Thomas M Dougherty
(74) *Attorney, Agent, or Firm*—Michael J. Donohue; Davis Wright Tremaine LLP

(57) ABSTRACT

Various micro-transducers incorporating piezoelectric materials for converting energy in one form to useful energy in another form are disclosed. In one embodiment, a piezoelectric micro-transducer can be operated either as a micro-heat engine, converting thermal energy into electrical energy, or as a micro-heat pump, consuming electrical energy to transfer thermal energy from a low-temperature heat source to a high-temperature heat sink. In another embodiment, a piezoelectric micro-transducer is used to convert the kinetic energy of an oscillating or vibrating body on which the micro-transducer is placed into useful electrical energy. A piezoelectric micro-transducer also is used to extract work from a pressurized stream of fluid. Also disclosed are a micro-internal combustion engine and a micro-heat engine based on the Rankine cycle in which a single fluid serves as a working fluid and a fuel.

14 Claims, 11 Drawing Sheets

U.S. PATENT DOCUMENTS

| | | | |
|---|---|---|---|
| 4,092,697 A | | 5/1978 | Spaight |
| 4,129,881 A | | 12/1978 | Reichel et al. |
| 4,140,936 A | | 2/1979 | Bullock |
| 4,186,323 A | | 1/1980 | Cragg et al. |
| 4,212,346 A | | 7/1980 | Boyd et al. |
| 4,254,431 A | | 3/1981 | Babuka et al. |
| 4,387,318 A | * | 6/1983 | Kolm et al. ............... 310/330 |
| 4,442,372 A | * | 4/1984 | Roberts ...................... 310/339 |
| 4,467,236 A | * | 8/1984 | Kolm et al. ............... 310/321 |
| 4,565,096 A | | 1/1986 | Knecht |
| 4,651,042 A | | 3/1987 | Nakamura |
| 4,742,867 A | | 5/1988 | Walsh et al. |
| 4,809,730 A | * | 3/1989 | Taft et al. ..................... 137/82 |
| 4,858,678 A | | 8/1989 | Ladd |
| 4,938,742 A | | 7/1990 | Smits |
| 5,039,901 A | * | 8/1991 | Newbould ................ 310/339 |
| 5,079,472 A | | 1/1992 | Uhl et al. |
| 5,170,930 A | | 12/1992 | Dolbear et al. |
| 5,192,197 A | | 3/1993 | Culp |
| 5,209,119 A | | 5/1993 | Polla et al. |
| 5,223,763 A | * | 6/1993 | Chang ........................ 310/339 |
| 5,379,601 A | | 1/1995 | Gillett |
| 5,394,379 A | | 2/1995 | Weichart et al. |
| 5,459,352 A | | 10/1995 | Layton et al. |
| 5,466,932 A | | 11/1995 | Young et al. |
| 5,481,152 A | | 1/1996 | Buschulte |
| 5,536,963 A | | 7/1996 | Polla |
| 5,561,984 A | | 10/1996 | Godshalk et al. |
| 5,594,292 A | | 1/1997 | Takeuchi et al. |
| 5,696,491 A | | 12/1997 | White et al. |
| 5,749,226 A | | 5/1998 | Bowman et al. |
| 5,808,874 A | | 9/1998 | Smith |
| 5,814,920 A | | 9/1998 | Takeuchi et al. |
| 5,814,921 A | * | 9/1998 | Carroll ........................ 310/339 |
| 5,889,353 A | | 3/1999 | Takeuchi et al. |
| 5,914,507 A | | 6/1999 | Polla et al. |
| 5,932,940 A | | 8/1999 | Epstein et al. |
| 6,011,346 A | * | 1/2000 | Buchanan et al. ........... 310/339 |
| 6,109,222 A | | 8/2000 | Glezer et al. |
| 6,124,145 A | | 9/2000 | Stemme et al. |
| 6,191,944 B1 | | 2/2001 | Hammel et al. |
| 6,281,573 B1 | | 8/2001 | Atwood et al. |
| 6,304,176 B1 | | 10/2001 | Discenzo |
| 6,351,952 B1 | | 3/2002 | Baker, III |
| 6,392,890 B1 | | 5/2002 | Katchmar |
| 6,406,605 B1 | | 6/2002 | Moles |
| 6,413,783 B1 | | 7/2002 | Wohlstadter et al. |
| 6,437,240 B2 | | 8/2002 | Smith |
| 6,574,963 B1 | | 6/2003 | Tadayon et al. |
| 6,606,251 B1 | | 8/2003 | Kenny, Jr. et al. |
| 6,628,040 B2 | | 9/2003 | Pelrine et al. |
| 6,628,522 B2 | | 9/2003 | Trautman et al. |
| 6,665,186 B1 | | 12/2003 | Calmidi et al. |
| 7,235,914 B2 | * | 6/2007 | Richards et al. ............ 310/328 |
| 2002/0184907 A1 | | 12/2002 | Vaiyapuri et al. |
| 2003/0043531 A1 | | 3/2003 | Trautman et al. |
| 2003/0097838 A1 | * | 5/2003 | Yazawa et al. ................ 60/527 |
| 2003/0173942 A1 | | 9/2003 | Kenny, Jr. et al. |
| 2003/0197448 A1 | | 10/2003 | Tanielian |
| 2003/0222341 A1 | | 12/2003 | Oberhardt et al. |
| 2003/0230403 A1 | | 12/2003 | Webb |
| 2005/0225213 A1 | * | 10/2005 | Richards et al. ............. 310/339 |
| 2006/0066434 A1 | * | 3/2006 | Richards et al. ............... 337/14 |
| 2007/0257766 A1 | * | 11/2007 | Richards et al. ............. 337/298 |

FOREIGN PATENT DOCUMENTS

| | | |
|---|---|---|
| EP | 0 673 102 A1 | 9/1996 |
| GB | 2 137 429 A | 10/1984 |
| GB | 2 326 275 A | 12/1998 |
| WO | WO-94/18433 A | 8/1994 |
| WO | WO-01/63738 A2 | 8/2001 |

OTHER PUBLICATIONS

Funasaka, T., et al., "Piezoelectric Generator Using a LiNbO$^3$ Plate with an Inverted Domain", *IEEE Ultrasonics Symposium*, (1998),959-962.

Goldfarb, M., et al., "On the Efficiency of Electric Power Generation with Piezoelectric Ceramic", *J. of Dynamic Systems, Measurement, and Control*, vol. 121, (Sep. 1999),566-571.

Kuehnel, Wolfgang, et al., "A Surface Micromachined Silicon Accelerometer With On-Chip Detection Circuitry", *Sensors and Actuators A*, vol. 45, (1994),7-16.

Lee, et al., "Characterization of Micromachined Piezoelectric PZT Force Sensors for Dynamic Scanning Force Microscopy", *Rev. Sci. Instrum.*, vol. 68, No. 5, (May 1997),2091-2100.

O'Connor, Leo, "Steam Engines on a Microscopic Scale", *Mechanical Engineering*, (Jan. 1994),76-78.

Polla, D.L., et al., "Ferroelectric Thin Films in Microelectromechanical Systems Applications", *MRS Bulletin*, (Jul. 1996),59-65.

Polla, D.L., et al., "Processing and Characterization of Piezoelectric Materials and Integration into Microelectromechanical Systems", *Annu. Rev. Mater. Sci.*, (1998),563-597.

Richards, R., et al., "Design for Micromanufacture: A Micro Heat Engine", *Presented at the National Science Foundation Grantees Research Meeting*, (Jan. 2001).

Richards, C.D., et al., "MEMS Power: The P$^3$ System", *Presented at the Intersocieity Energy Conversion Conference*, (Jul. 2001).

Umeda, M., et al., "Analysis of the Transformation of Mechanical Impact Energy to Electric Energy to Electric Energy Using Piezoelectric Vibrator", *Jpn. J. Appl. Phys.*, vol. 35, (1996),566-571.

Umeda, M., et al., "Energy Storage Characteristics of a Piezo-Generator Using Impact Induced Vibration", *Jpn. J. Appl. Phys.*, vol. 36, (1997),3146-3151.

Wakabayashi, S., et al., "Static Characteristics of Piezoelectric Thin Film Buckling Actuator", *Jpn. J. Appl. Phys.*, vol. 35, (1996),5012-5014.

Xu, C., "Design of a Micro Heat Engine", *MEMS (Micro-Electro-Mechanical Systems)*, vol. 2, (2000),261-267.

Xu, C., et al., "Design of a Micro Heat Engine", *Presented at the International Mechanical Engineering Congress and Exposition*, (Nov. 2000).

* cited by examiner

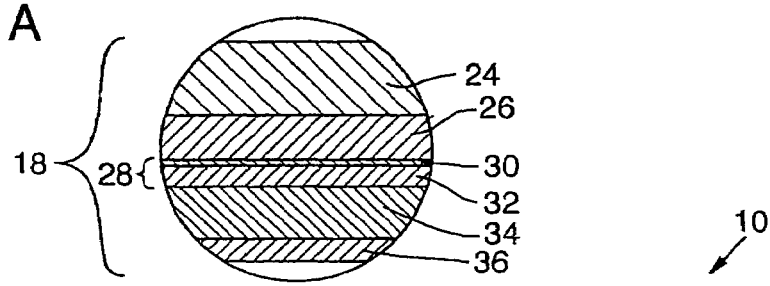
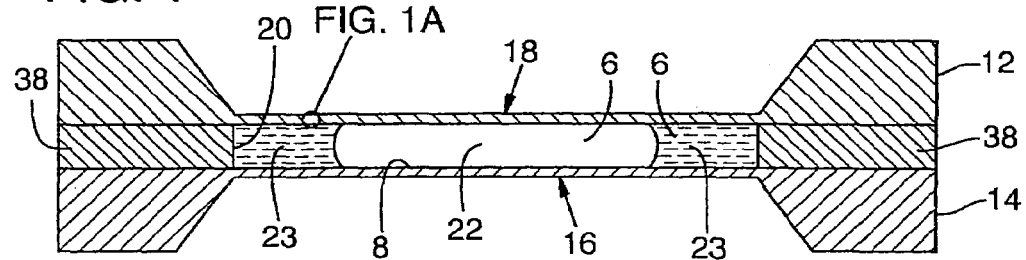
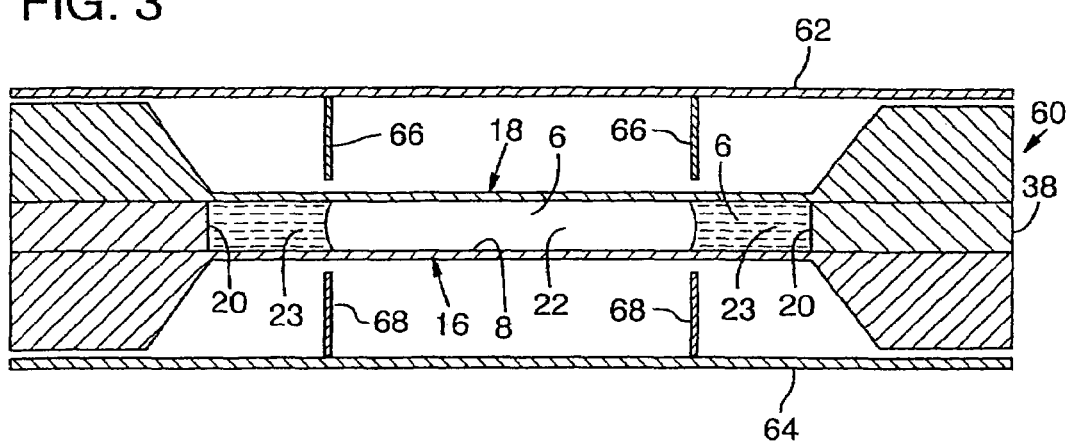

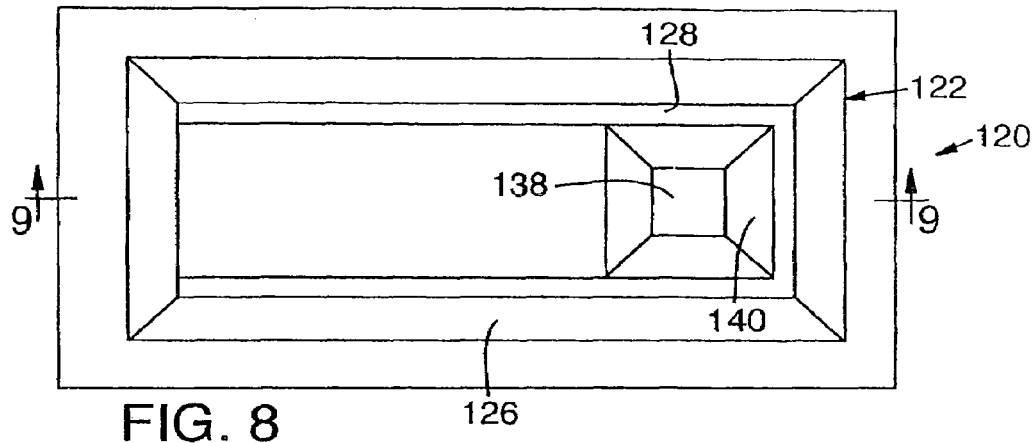
FIG. 8
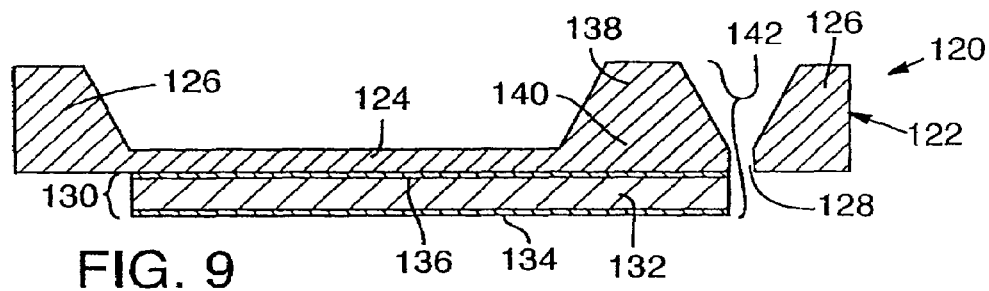
FIG. 9
FIG. 10
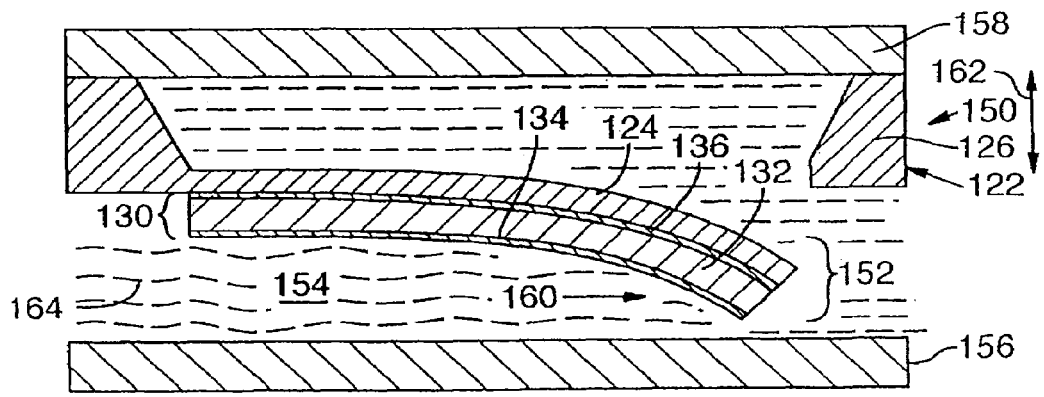

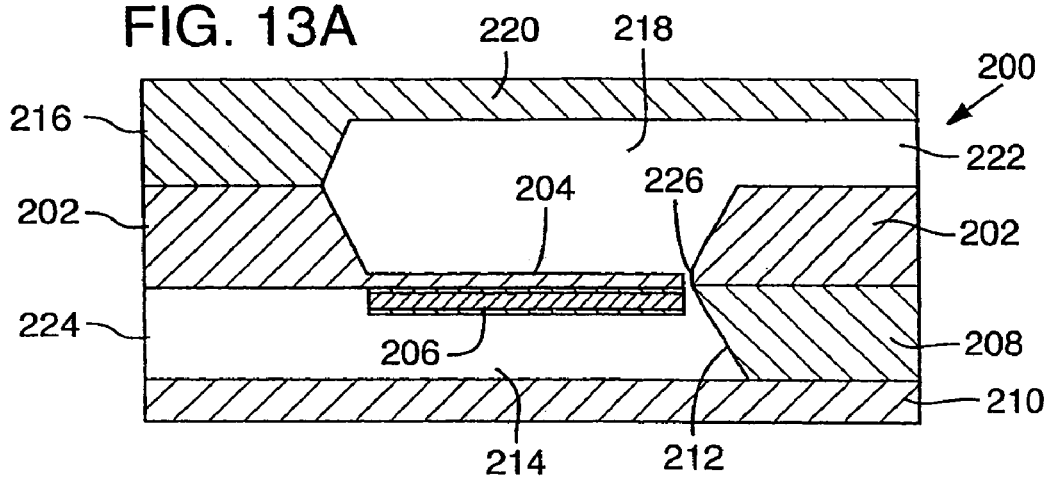
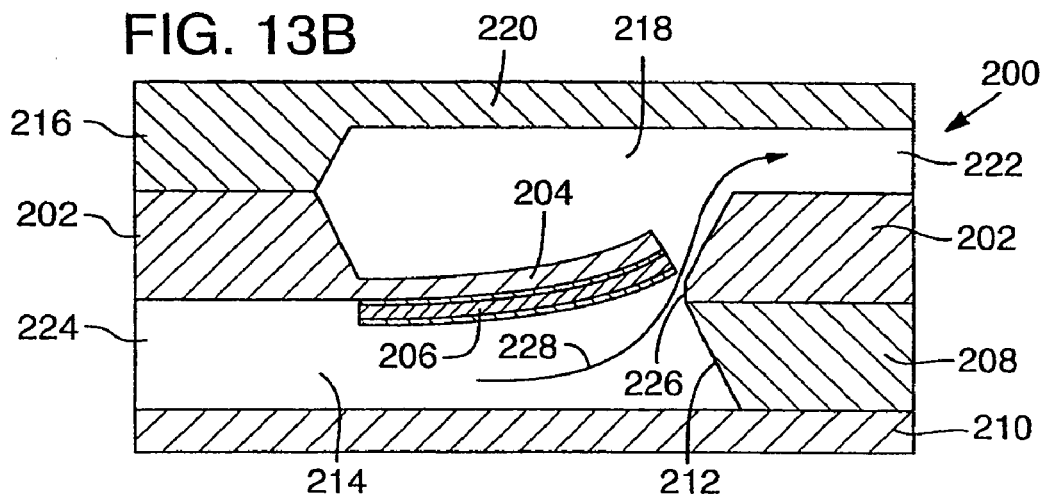
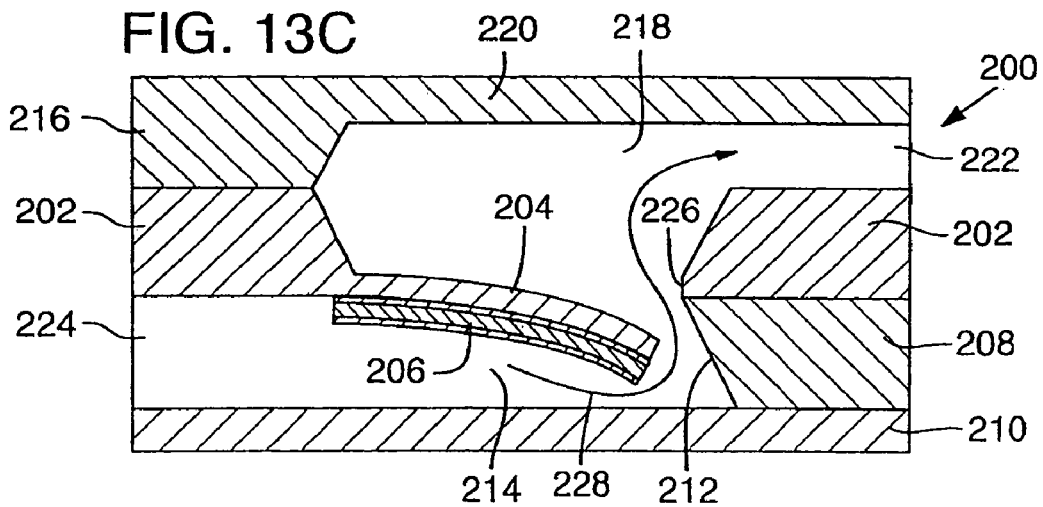

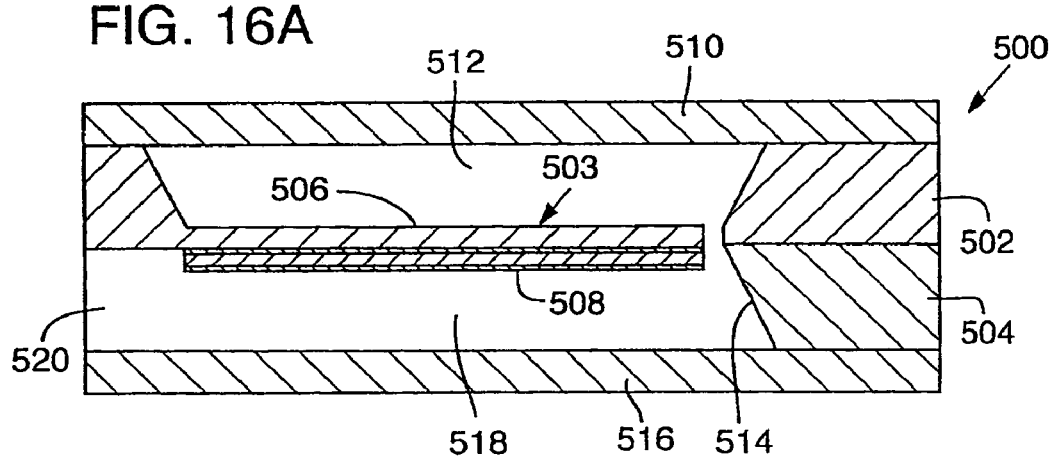
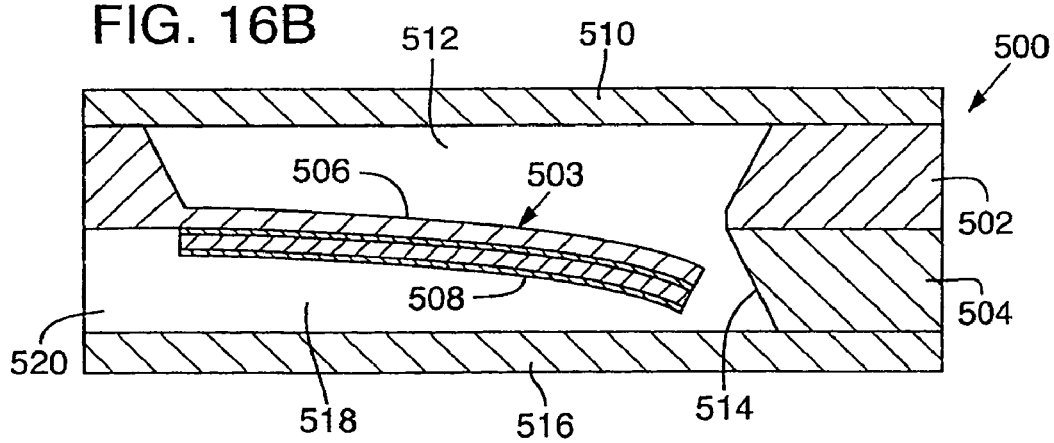

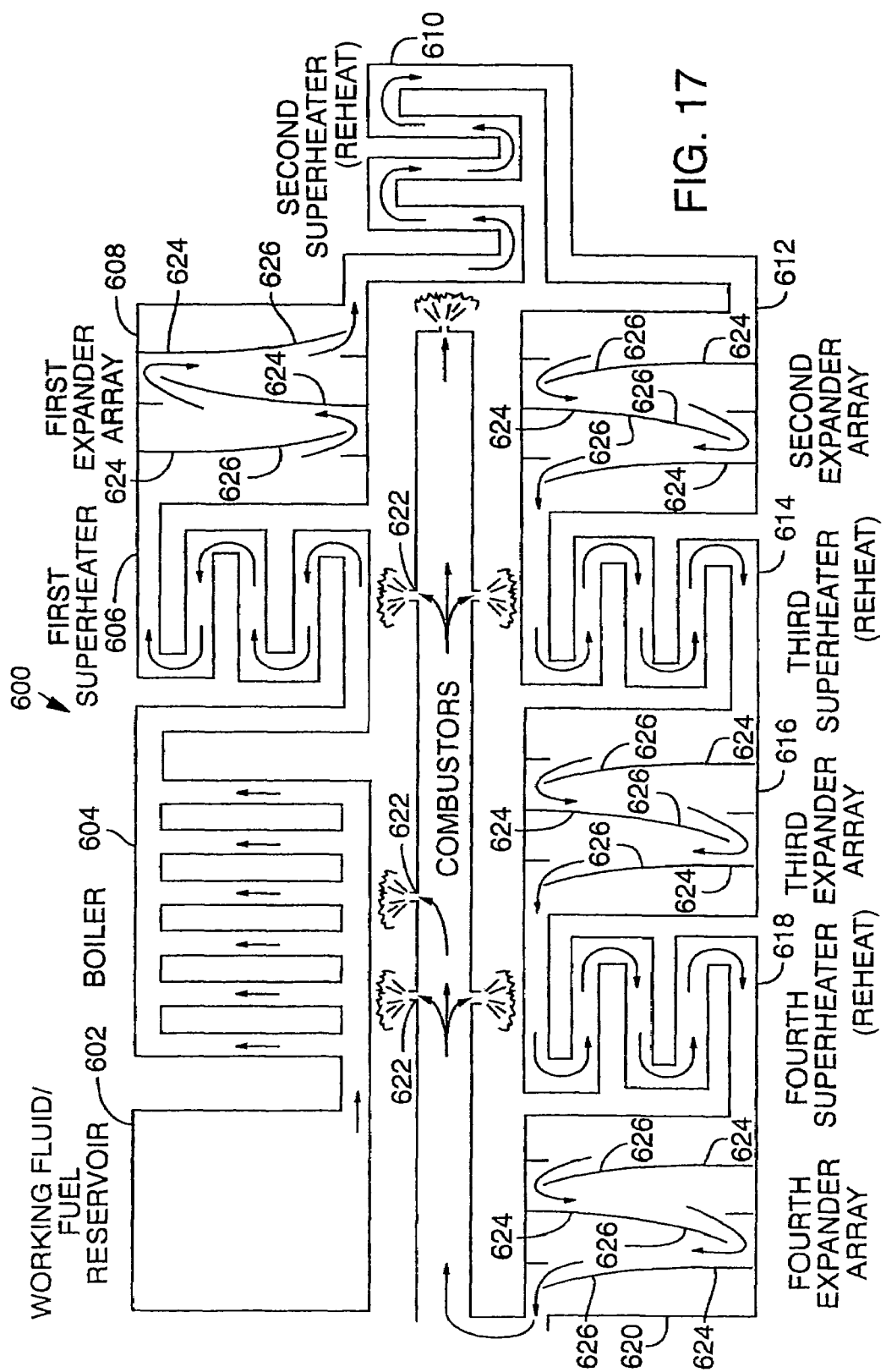

PIEZOELECTRIC MICRO-TRANSDUCERS, METHODS OF USE AND MANUFACTURING METHODS FOR SAME

CROSS-REFERENCE TO RELATED APPLICATION

The present application claims priority from prior U.S. provisional application No. 60/243,447, filed on Oct. 25, 2000, which is incorporated herein by reference.

FEDERAL GRANT

This invention was developed with support under Grant Number 99-80-837 from the National Science Foundation.

FIELD

This invention relates generally to micro-transducers having piezoelectric properties which can be used for converting energy in one form to useful energy in another form.

BACKGROUND

The need for miniaturized power sources for micro-electro-mechanical systems (MEMS) and micro-electronics has long been recognized. Much work has already been done on micro-scale batteries, and micro-scale heat engines. Micro-scale heat engines are a particularly attractive option, because of the very high density energy storage afforded by the hydrocarbon fuels they burn. Thus, a micro-heat engine which could convert the chemical energy stored in a hydrocarbon fuel to mechanical or electrical energy could form the basis of a very compact power supply.

Attempts to construct a micro-heat engine have been directed to redesigning the hardware for conventional large-scale heat engines to be fabricated on the micro-scale. So far, these attempts are still in the developmental stages and have not yet proven to be successful.

Although not true heat engines, thermally driven devices have been constructed on the micro-scale. In one such device, water contained in a cavity, when heated, pushes a drive shaft. Upon cooling, the water condenses and the capillary action of the liquid pulls the drive shaft back in. However, because the device uses electrical power to heat and vaporize the working fluid and because there is no provision to cyclically heat and cool the working fluid, the device functions as an actuator, not as a true heat engine. Other thermally driven actuators rely on the thermal expansion of solids, or the change in shape of so-called shape-memory alloys to exert forces over small distances. Again, these devices are not true heat engines because they do not operate cyclically, and they do not transform thermal energy into mechanical or electrical power.

Piezoelectric thin films have been used for years as power transducers in MEMS and micro-electronic devices. Piezoelectric films are an attractive option for power transduction because of the relative ease with which such devices can be produced using conventional micro-machining methods. Generally speaking, micro-machining involves processing techniques, such as micro-lithography and etching, that were developed and refined for use in the manufacture of integrated circuits. Micro-machining allows fine control of dimensions and is commonly employed for producing parts from silicon. However, micro-machining is not restricted in its application to the formation of workpieces from silicon or other materials conventionally used in the manufacture of integrated circuits, and it is known to apply micro-machining to other materials.

In most applications of piezoelectric films, such as in micro-actuators, pumps and valves, electrical power is converted to mechanical power. Micro-sensors that utilize piezoelectric films also have been used for mechanical to electrical transduction, however, such devices are not capable of producing usable electrical power to any significant degree. Thus, it would be desirable to utilize piezoelectric thin films for converting energy in one form, such as thermal energy or kinetic energy, to useful electrical energy to power MEMS and micro-electronic devices.

Along with the need for miniaturized power sources is the need for micro-devices that are designed to remove heat from MEMS and micro-electronics. In particular, integrated circuit manufacturers are already reaching limits on micro-processor speed and performance imposed by high operating temperatures. Consequently, reducing chip operating temperatures by removing waste heat through active cooling is considered to be among the most promising strategies available to the micro-processor industry for overcoming these obstacles. Thus, it would be desirable to implement a piezoelectric film in a micro-heat pump for cooling applications of MEMS and micro-electronics.

Therefore, there exists a strong need for piezoelectric micro-transducers for use with MEMS and micro-electronic devices.

SUMMARY

A micro-transducer according to one embodiment comprises a first membrane, a second membrane, a fluid-tight cavity cooperatively formed between the first and second membranes, and a working fluid disposed in the cavity. The first membrane includes a first electrode, a second electrode, and a piezoelectric member disposed therebetween.

The micro-transducer may be operated as a micro-heat engine or a micro-heat pump. In the case of a micro-heat pump, a low-temperature heat sink is disposed adjacent the second membrane and a high-temperature heat source is disposed adjacent the first membrane. The high-temperature heat source and the low-temperature heat sink periodically thermally contact the first and second membranes, respectively, so that thermal energy, flowing from the high-temperature heat source to the low-temperature heat sink through the micro-heat engine is converted into electrical energy. In the case of a micro-heat pump, a low-temperature heat source is disposed adjacent the first membrane and a high-temperature heat sink is disposed adjacent the second membrane. The low-temperature heat source and the high-temperature heat sink periodically thermally contact the first and second membranes, respectively. Electrical energy is consumed by the micro-heat pump to transfer heat from the low-temperature heat source to the high-temperature heat sink. In both the micro-heat engine and the micro-heat pump, the working fluid desirably comprises a saturated mixture of vapor and liquid.

According to another embodiment, a plurality of micro-transducers are formed in a pair of first and second substrates, such as silicon wafers. A plurality of fluid-tight cavities are cooperatively formed between the first and second substrates, and a working fluid is contained in the cavities. A plurality of piezoelectric units are formed at each of the cavities on either the first or second substrates. Each piezoelectric unit comprises a first electrode, a second electrode, and a piezoelectric layer interposed between the first and second electrodes. Additional pairs of first and second substrates, each comprising an array of micro-transducers, may be stacked on top of each other, so as to form a system of cascading levels, in which each level operates over its own temperature differential.

A method according to one embodiment for constructing a micro-transducer comprises providing a first substrate and a second substrate. A first metallic layer, a piezoelectric layer, and a second metallic layer are formed on either the first or second substrate. A cavity is formed between the first substrate and the second substrate, and a working fluid is introduced into the cavity. The first substrate and the second substrate are then joined together so as to seal the fluid in the cavity. In one specific approach, an intermediate layer comprising, for example, a layer of photo-resist material, is interposed between the first and second substrates. The cavity is defined by the first and second substrates and an aperture formed in the intermediate layer. Recesses may be formed in the first and second substrates, such as by etching away portions of the first and second substrates, to form first and second membranes of the micro-transducer through which thermal energy may be conducted.

A method according to one embodiment of generating electrical energy with a micro-transducer also is provided. The micro-transducer has a chamber for receiving a fluid and a surface comprising a piezoelectric generator. A fluid is introduced into the chamber of the micro-transducer. The fluid is expanded to cause the piezoelectric generator to deflect outwardly, thereby generating an electric charge. In one specific approach, the fluid is a working fluid sealed in the chamber, and heat energy is flowed through the micro-transducer between a high-temperature heat source and a low-temperature heat sink to cause expansion of the working fluid. In another approach, the fluid comprises a mixture of a fuel and an oxidizer, which is ignited in the fluid chamber. The combustion of the mixture of the fuel and oxidizer causes the piezoelectric generator to deflect outwardly from the fluid chamber, thereby generating an electric charge.

According to another embodiment, a method of converting kinetic energy to electrical energy with a piezoelectric generator comprises coupling the piezoelectric generator to an oscillating body. The oscillations of the body causes the piezoelectric generator to oscillate, thereby generating an electric charge, which may be removed from the piezoelectric generator for powering an electrical device or for recharging a battery. Desirably, the piezoelectric generator is configured to have a resonant mechanical frequency approximately equal to the frequency of oscillation of the body to maximize electrical energy generated by the piezoelectric generator.

A micro-transducer according to another embodiment comprises a support structure. A piezoelectric generator is coupled to the support structure and is deflectable relative to the support structure. A mass is carried by the piezoelectric generator at a position to decrease the resonant mechanical frequency of the piezoelectric generator.

BRIEF DESCRIPTION OF THE DRAWINGS

FIG. 1 shows an enlarged cross-sectional view of a piezoelectric micro-transducer according to one embodiment of the present invention.

FIG. 3 shows an enlarged cross-sectional view of a piezoelectric micro-heat pump having the same general construction of the micro-transducer of FIG. 1, shown operating between a low-temperature heat source and a high-temperature heat sink.

FIG. 8 is a top plan view of a cantilever-type piezoelectric micro-transducer according to yet another embodiment.

FIG. 9 is a cross-sectional view of the micro-transducer of FIG. 8, taken along line 9-9 of FIG. 8.

FIG. 10 is a cross-sectional view of a cantilever-type piezoelectric micro-transducer according to another embodiment for converting kinetic energy from a pressurized stream of fluid into electrical energy, wherein the cantilever is pre-stressed.

FIGS. 13A-13C are cross-sectional views of a piezoelectric micro-transducer according to another embodiment, comprising a free-vibrating piezoelectric cantilever for converting kinetic energy of a steady-state stream of fluid into electrical energy.

FIGS. 16A-16B are cross-sectional views of piezoelectric micro-transducer according to another embodiment configured for use as a micro-internal combustion engine.

FIG. 17 is a schematic illustration of a micro-Rankine cycle heat engine in which a single fluid serves as a working fluid and a fuel for the heat engine.

DESCRIPTION OF THE INVENTION

Figure 2A:
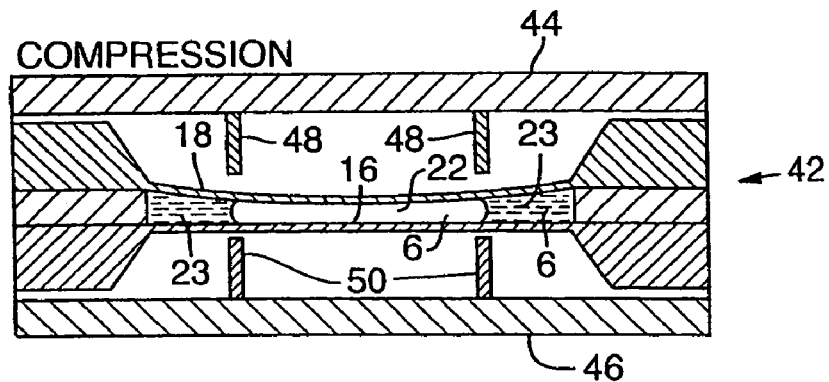
FIGS. 2A-2D illustrate the thermodynamic cycle of a piezoelectric micro-heat engine having the same general construction of the micro-transducer of FIG. 1, shown operating between a high-temperature heat source and a low-temperature heat sink.

As used in this description, the term "transducer" is used to denote a device for converting useful energy in one form to useful energy in another form. For example, energy may be converted from the energy of mechanical motion to an electric current or from thermal energy to mechanical motion. Additionally, it is known that many transducers that can be operated in one mode can also be operated in a reverse mode. As an example, a device may be operated both as an electrical motor to convert energy from electric current to mechanical motion, or it may be operated as a generator to convert mechanical motion to electric current. Also, "piezoelectric materials" refer to those materials in which a mechanical stress applied as a result of, for example, bending, deflection, or flexure, produces an electrical polarization, and conversely, an applied electric field induces a mechanical strain that causes a mechanical displacement of the material (e.g., in the form of bending, deflection, or flexure). The term "substrate" as used herein refers to any support material from which one or more micro-transducers can be constructed and is not limited to materials, such as silicon wafers, conventionally used in the manufacture of semiconductor devices.

Micro-Heat Engine/Micro-Heat Pump

According to one aspect, a micro-transducer can be used either as a micro-heat engine to convert thermal energy, flowing from a higher temperature to a lower temperature, into electric current or as a micro-heat pump, i.e., a micro-refrigerator, that consumes electric energy to pump thermal energy from a lower temperature to a higher temperature. The micro-transducer has particular applicability for use as a micro-heat engine for providing electrical power to MEMS or micro-electronic devices, for example, or as a micro-heat pump to remove heat from MEMS or micro-electronic devices.

FIG. 1 shows an enlarged cross section of a micro-transducer 10 according to a one embodiment. The micro-transducer 10 in the illustrated configuration has a cell-like structure that comprises a first major layer 12 and a second major layer 14. The micro-transducer 10 has a generally rectangular shape, although in other embodiments the micro-transducer 10 may be circular or any of other various shapes. In a working embodiment, the first and second major layers 12 and 14 comprise silicon wafers. However, the micro-transducer 10 may be fabricated from materials other than silicon, such as quartz, sapphire, plastic, ceramic, or a thin-film metal such as aluminum. Methods for manufacturing the micro-transducer 10 from a silicon wafer or other equivalent material are described in detail below.

A fluid cavity 8 is cooperatively formed between the first major layer 12 and the second major layer 14. In the present embodiment, for example, the fluid cavity 8 is bounded by a first membrane 18 (shown as an upper membrane 18 in FIG. 1) of the micro-transducer 10, a second membrane 16 (shown as a lower membrane 16 in FIG. 1) of the micro-transducer 10, and side walls 20. The second membrane 16 comprises a recessed portion, or an area of reduced thickness, defined in the second major layer 14. The first membrane 18 similarly comprises a recessed portion, or an area of reduced thickness. The side walls 20 are defined by a generally rectangular aperture formed in an intermediate layer 38 disposed between the first major layer 12 and the second major layer 14.

A working fluid 6 is contained within the fluid cavity 8. As shown in FIG. 1, the working fluid 6 may comprise two phases including a saturated vapor 22 and a saturated liquid 23. Desirably, the working fluid employed in the micro-transducer 10 is selected so that it remains as a saturated liquid-vapor mixture throughout the thermodynamic cycle of the micro-transducer 10. The selection of the particular two-phase working fluid will depend upon the working temperatures of the micro-transducer 10. For example, in relatively low-temperature applications (i.e., less than 200° F.), refrigerants such as R11 have proven to be suitable. In moderate-temperature applications (i.e., above 200° F.), water may be used as the two-phase working fluid. Although less desirable for reasons explained below, the working fluid 6 may be comprised entirely of a vapor or a liquid.

In any event, the use of a two-phase working fluid is significant in that the thermal efficiency attained by the transducer approaches that of the ideal Carnot cycle. In conventional large-scale heat engines and heat pumps, two-phase fluids cannot be used because surface tension causes the liquid portion of a two-phase saturated mixture to form small droplets that can quickly destroy thermal machinery during expansion and compression processes. In the present embodiment, however, the use of a two-phase working fluid is possible because of the surface tension forces that occur on the micro-scale. Specifically, and as shown in FIG. 1, surface tension causes the liquid portion 23 to separate from the vapor portion 22 and adhere to the inside walls 20 of the transducer 10 so as to prevent the formation of liquid droplets that would otherwise harm the transducer.

In FIG. 1A, the depicted magnified section of FIG. 1 illustrates that the first membrane 18 desirably includes a support layer 24 which comprises the material of the first major layer 12 (e.g., silicon in the present example). An optional silicon oxide layer 26 is juxtaposed to the support layer 24; a first electrode 28 (shown as a top electrode in FIG. 1A) is juxtaposed to the oxide layer 26; a piezoelectric member or layer 34 is juxtaposed to the top electrode; and a second electrode 36 (shown as a bottom electrode in FIG. 1A) is juxtaposed to the bottom electrode 36. The support layer 24, oxide layer 26, top electrode 28, piezoelectric layer 34, and bottom electrode 36 collectively define the first membrane 18.

The first and second electrodes 28, 36, respectively, may comprise any suitable material. In a working embodiment, for example, the bottom electrode 36 comprises a layer of gold (Au). The first electrode 28 comprises a first layer 32 of platinum (Pt) and an optional second layer 30 of titanium (Ti) to facilitate adhesion of the platinum layer to the silicon oxide layer 26. The piezoelectric layer 34 may be made from any material having sufficient piezoelectric properties, such as lead zirconate titanate (PZT) or zinc oxide (ZnO).

The intermediate layer 38 comprises, for example, a layer of photo-resist material, such as SU-8 (available from Shell Chemical Co.). An aperture is formed in the photo-resist material so as to form the side walls 20 of the micro-transducer 10. The second membrane 16 of the micro-transducer 10 comprises the material of the second major layer (e.g., silicon in the present case). The second membrane 16 has a thickness greater than that of the first membrane 18, and therefore the second membrane 16 is generally more rigid than the first membrane. Consequently, the first membrane 18 flexes inwardly and outwardly while the second membrane 16 retains a substantially constant profile during operation of the micro-transducer 10.

Generally speaking, the piezoelectric layer 34 together with the electrodes 28 and 36 define a piezoelectric unit that functions as both a piezoelectric actuator (converting electrical work to mechanical work) and as a piezoelectric generator (converting mechanical work to electrical work). For operation as an actuator, a voltage applied to the top and bottom electrodes, 28 and 36, respectively, causes the piezoelectric layer 34, and thereby the first membrane 18, to flex inwardly, thereby compressing the vapor phase 22 of the working fluid 6. Conversely, for operation as a generator, a voltage is generated across the top and bottom electrodes, 28 and 36, respectively, when the vapor phase 22 of the working fluid 6 expands to cause the piezoelectric layer 34, and thereby the first membrane 18, to flex outwardly. Thus, the first membrane 18 flexes in and out, alternately expanding and compressing, respectively, the vapor phase of the working fluid contained within the transducer. Unlike sliding and rotating parts in conventional machinery, however, the micro-transducer 10 eliminates the problem of dissipative losses due to sliding friction. Further details of the operation and design of the micro-transducer 10 are described below, first with reference to a micro-heat engine and then with reference to a micro-heat pump.

Micro-Heat Engine

FIGS. 2A-2D illustrate the thermodynamic cycle of a heat engine 42 according to a one embodiment operating between a high-temperature heat source 44 and a low-temperature heat sink 46. In the illustrated embodiment, the high-temperature heat source 44 has thermal switches, or contacts, 48 operable to periodically thermally couple the first membrane 18 with the high-temperature heat source 44. Similarly, the low-temperature heat sink 46 has thermal switches, or contacts, 50 operable to periodically thermally couple the second membrane 16 with the low-temperature heat sink 46. The thermodynamic cycle of the heat engine 42, which is based on the Carnot vapor cycle, consists of the following four processes: (1) compression, (2) high-temperature heat-addition, (3) expansion and electrical power production, and (4) low-temperature heat-rejection. During this four-process cycle, the first membrane 18 of the heat engine 42 completes one full oscillation.

The first process of the cycle, compression, is represented by FIG. 2A. In the compression stroke of an initial cycle, an electrical switch (not shown) connected to the top and bottom electrodes 28 and 36 (FIG. 1A) is closed to generate a voltage across the piezoelectric layer 34 (FIG. 1A). The applied voltage causes the piezoelectric layer 34 (FIG. 1A), and thereby the first membrane 18, to flex downwardly toward the second membrane 16, thereby compressing the vapor 22. As the overall volume of the working fluid 6 decreases, the pressure of the working fluid 6 increases, which results in a corresponding increase in temperature. At the end of the compression process, the electrical switch is opened whereby piezoelectric layer 34 becomes a capacitor that stores any charge accumulated on the electrodes 28 and 36 during the time period in which the voltage was applied.

Figure 2B:
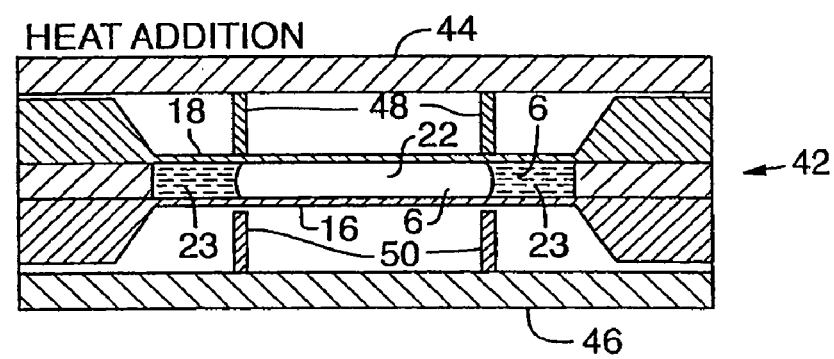

During the second process, high-temperature heat-addition, the high-temperature heat source 44 is thermally coupled to the first membrane 18 via thermal switches 48 to transfer thermal energy to the heat engine 42 through conduction (as shown in FIG. 2B). As heat moves into the working fluid 6, some of the liquid portion 23 of the working fluid 6 vaporizes, thereby increasing the overall volume the working fluid 6 and causing an upward displacement of the first membrane 18. With the upward displacement of the first membrane 18, the applied strain increases the dipole moment of piezoelectric layer 34 (FIG. 1A), which in turn causes an increase in the open-circuit voltage of the electrodes 28 and 36 (FIG. 1A). At the end of the heat-addition process, the temperature and pressure in the working fluid 6, as well as the open-circuit voltage across the electrodes 28 and 36, will have reached their respective maximum values of the working cycle.

Figure 2C:
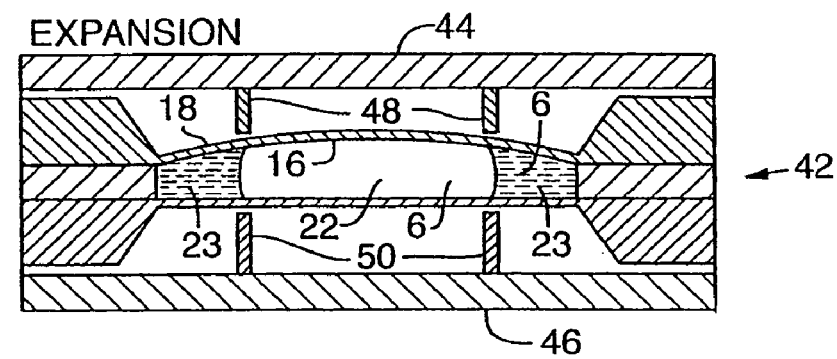

Referring to FIG. 2C, there is shown the third process, expansion and electrical power production from the coupling with heat source 44 in FIG. 2B. In this process, the previously described electrical switch (not shown) is closed to allow for the removal of the electric charge stored in the electrodes 28 and 36 (FIG. 1A). The resulting electric current flows from the electrodes to, for example, an electronic power conditioner (not shown), where the energy can be made available in a form usable by micro-electronic devices or MEMS. As charge is drained from the electrodes 28 and 36, the modulus of elasticity and the resulting strain of the piezoelectric layer 34 (FIG. 1A) decrease from a higher open-circuit value to a lower closed-circuit value. Accordingly, the piezoelectric layer 34 (FIG. 1A) relaxes, which allows the first membrane 18 to flex upwardly under the pressure of the working fluid 6. The vapor 22 of the working fluid 6 therefore expands as pressure and temperature decrease until the first membrane 18 reaches its point of greatest outward deflection, as shown in FIG. 2C.

Figure 2D:
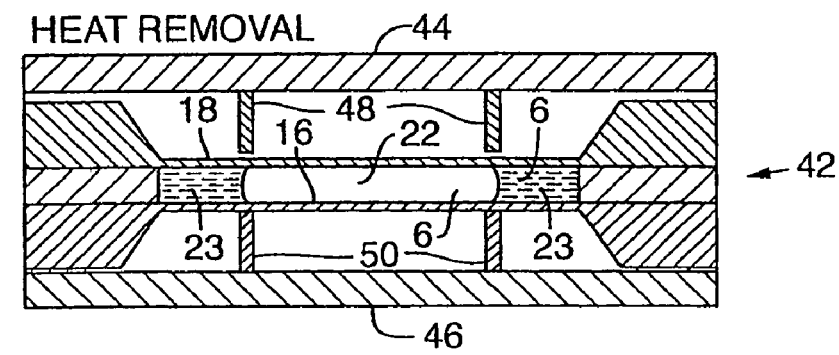

During the fourth process, low-temperature heat-rejection, the low-temperature heat sink 46 is thermally coupled to the second membrane 16 via thermal switches 50 to remove thermal energy from the heat engine 42 through conduction (as shown in FIG. 2D). As heat is removed from the heat engine 42, some of the vapor 22 condenses, which causes a decrease in the volume of the working fluid 6. Such decrease in the volume of the working fluid 6 results in a return deflection of the first membrane 18 and a corresponding decrease in strain in the piezoelectric layer 34 (FIG. 1A). Since the low-temperature heat-rejection process occurs with the electrical switch closed and no external voltage applied, the piezoelectric layer 34 is short-circuited. As a result, no charge can build up in the piezoelectric layer 34 (FIG. 1A), and the modulus of elasticity of the piezoelectric layer 34 (FIG. 1A) returns to its higher open-circuit value to assist return of the first membrane 18 to its inwardly deflected position of FIG. 2A. Following the heat-rejection process, the thermodynamic cycle then repeats itself, starting again with the compression process.

The efficiency of the mechanical-to-electrical conversion in the piezoelectric layer 34 will depend strongly upon how closely the frequency of oscillation of the first membrane 18 matches its resonant mechanical frequency. This is because only a portion (about one-tenth) of the mechanical energy transferred into the piezoelectric layer 34 as strain is converted into electrical energy (the remaining portion of mechanical energy is stored as spring energy). Thus, if the heat engine 42 is operated at or near the resonant mechanical frequency of the first membrane 18, mechanical energy not converted to electrical energy but stored as spring energy can be reclaimed later in the cycle. In particular, this stored spring energy can be used to achieve compression (process one, FIG. 2A) of the working fluid subsequent to the initial cycle. Such recovery of the strain energy will effect a substantial increase in engine efficiency since compression is accomplished without drawing current from an outside source. Conversely, operating with an oscillation frequency not equal to the resonant frequency will result in the loss of some or all of this stored spring energy, accompanied by a subsequent loss of engine efficiency.

Since thermal energy is transferred into the heat engine 42 from an external source, the heat engine 42 operates in a manner that is similar to that of a large-scale external-combustion engine. However, unlike conventional large-scale external-combustion engines, the working fluid does not circulate from the heat engine 42 to a separate heat exchanger. Instead, heat is alternately transferred in and out of the heat engine via conduction through the second and first membranes 16, 18, while the working fluid remains inside the heat engine 42. In essence, the heat engine 42 functions as its own heat exchanger, which is a consequence of the large surface-to-volume ratio that can be achieved on the micro-scale level. Thus, it should be apparent that the micro-heat engine 42 integrates all heat-engine functions into a self-contained cell-like structure. Such a design solution would be impossible in a large-scale engine.

Although a single heat engine 42 may be sufficient to supply the power requirements for certain applications, multiple heat engines may be connected in parallel to increase power output. For example, if one heat engine operating at a predetermined cycling frequency generates one milliwatt, then ten heat engines connected in parallel and operating at the same frequency would generate ten milliwatts. It is then possible to provide a power source that is operable to generate anywhere from one milliwatt to several watts of power, or move, by varying the number of heat engines.

Figure 5:
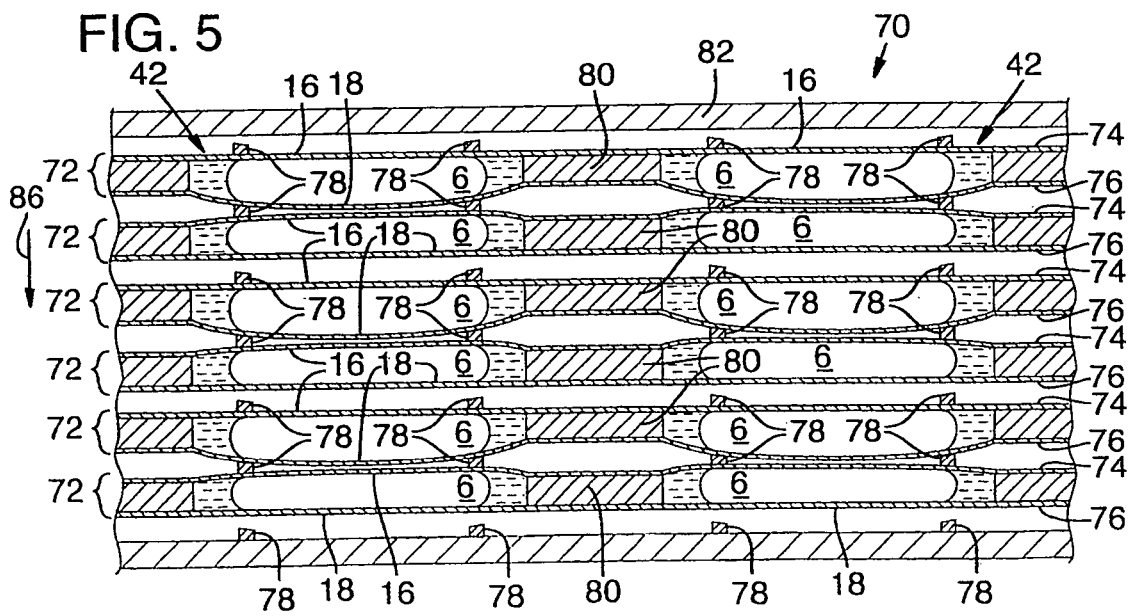
FIG. 5 is a partial, sectional view of an apparatus according to another embodiment, comprising pairs of first and second substrates stacked superposedly, with an array of identical piezoelectric micro-heat engines formed in each pair of substrates.

Referring to FIG. 5, for example, there is shown an apparatus 70 comprising pairs 72 of first and second substrates 74, 76, respectively, (e.g., pairs of silicon wafers) stacked superposedly with respect to each other so as to form a system of cascading levels, each of which operating over its own temperature differential. An array of identical heat engines 42 are micro-machined into each pair 72 of first and second substrates 74 and 76, respectively, and an intermediate layer 80 (e.g., a layer of photo-resist material) is disposed between each pair of substrates. In this arrangement, each heat engine 42 is aligned with another heat engine 42 of an adjacent level, with an intervening insulating layer of air. Each heat engine 42 comprises a flexible first membrane 18 having a piezoelectric unit (i.e., a piezoelectric layer disposed between two electrodes) and a substantially rigid second membrane 16. Thermal switches or contacts 78 may be positioned on the second membranes 16 of the heat engines 42.

A high-temperature heat source 82 is positioned adjacent to the second membranes 16 of the level operating in the highest temperature range in the cascade (shown as the uppermost pair 72 of substrates 74 and 76 in FIG. 5). The high-temperature heat source 82 is operable to periodically thermally contact the adjacent second membranes 16. Thermal contacts 78 may be disposed on the high-temperature heat source 82 for contact with the adjacent second membranes 16. Similarly, a low-temperature heat sink 84 is positioned adjacent to the first membranes 18 of the level operating in the lowest temperature range (shown as the lowermost pair 72 of substrates 74 and 76 in FIG. 5). The low-temperature heat sink 84 is operable to periodically thermally contact the adjacent first membranes 18 and, like the high-temperature heat source 82, the low-temperature heat sink may include thermal contacts 78. Thus, thermal energy is conducted through the apparatus 70 in the direction indicated by arrow 86.

In FIG. 5, the apparatus 70 is operated so that the thermodynamic cycles of the heat engines 42 are synchronized. That is, each heat engine 42 in a particular level undergoes the same process of the thermodynamic cycle at the same time. However, each level operates 180° out of phase from the adjacent level(s). For example, when the heat engines 42 of one level undergo a heat-addition process, the heat engines 42 of an adjacent level undergo a heat-rejection process. Thus, the first membrane 18 of each heat engine 42 serves as the high-temperature heat source for the high-temperature heat-addition process (process two) of a heat engine 42 in an adjacent level of a lower temperature range. Similarly, the second membrane 16 of each heat engine 42 serves as the low-temperature heat sink for the low-temperature heat-rejection process (process four) of a heat engine 42 in an adjacent level of a higher temperature range. The thermal switches 78 are positioned on the second membranes 16 to facilitate conduction of thermal energy from the first membranes 18 to respective second membranes 16 in an adjacent level of a lower temperature range.

The use of a cascading arrangement is advantageous because the temperature differential of each heat engine 42 is relatively small due to the limited expansion and compression ratio that can be achieved with the piezoelectric member. Thus, by configuring a cascade of heat engines 42, it is possible to provide a power source that works over any arbitrarily large temperature range. Operating in a cascading arrangement is also desirable in that it is possible to select a working fluid 6 that is most appropriate for the pressure and temperature range of a particular level.

To ensure that there is adequate heat transfer through the heat engine 42, the dimensions of the heat engine 42 desirably, although not necessarily, provide for a low aspect ratio (i.e., a low thickness-to-width ratio) in order to maximize heat-transfer area and minimize conduction path lengths. A suitable aspect ratio that is sufficiently low can be obtained with a heat engine having first and second membranes each having a thickness of about 5 microns or less. The thickness of the engine cavity 8, i.e., the distance between the membranes 16, 18, desirably is about 50 microns or less. As such, the working fluid in the engine cavity 8 will be in the form of a thin layer. In contrast, the lengths of the membranes desirably are relatively larger than their thicknesses, for example, between 1 to 5 mm, although larger or smaller membranes may be used.

EXAMPLE

In one example of a micro-heat engine 42, the first membrane 18 has a thickness of about 2 microns, the second membrane 16 has a thickness of about 5 microns, and the thickness of the engine cavity is about 25 microns. The total length of the conduction path through the heat engine is therefore about 32 microns. The surfaces of the second and first membranes have dimensions of approximately 2.0 millimeters by 2.0 millimeters, which provides an aspect ratio of about 0.0160 and a heat-transfer area of 4.0 millimeters 2 at each membrane. It has been found that the foregoing dimensions will ensure a maximum surface area per unit volume of working fluid and a conduction path sufficiently short to drive heat through the heat engine. The thicknesses of the silicon layer 24 and the silicon oxide layer 26 of the first membrane 18 are about 600-nm and 400-nm, respectively. The top electrode 18 comprises a 20-nm thick layer of Ti and a 200-nm thick layer of Pt. The piezoelectric member 34 comprises a 500-nm thick layer of PZT. The bottom electrode comprises a 200-nm thick layer of Au. The working fluid is R11.

Of course, those skilled in the art will realize that the foregoing dimensions (as well as other dimensions provided in the present specification) are given to illustrate certain aspects of the invention and not to limit them. These dimensions can be modified as needed in different applications or situations.

Micro-Heat Pump

By reversing the operating cycle of the heat engine 42 shown in FIGS. 2A-2D, the heat engine can be used as a micro-heat pump or refrigerator. Referring now to FIG. 3, there is shown a heat pump 60, having the same general construction as the micro-transducer 10 of FIG. 1, operating between a low-temperature heat source 62 and a high-temperature heat sink 64. In the illustrated embodiment, the high-temperature heat sink 64 comprises thermal switches 68 for periodically thermally coupling the second membrane 16 with the high-temperature heat sink 64. Similarly, the low-temperature heat source 62 has thermal switches 66 to periodically thermally couple the first membrane 18 with the low-temperature heat source 62.

During the working cycle of the heat pump 60, low-temperature thermal energy is transferred into the heat pump 60 from the low-temperature heat source 62 by conduction. By compressing the vapor 22 of the working fluid 6, the low-temperature thermal energy is transformed into high-temperature thermal energy, which is then transferred out of the heat pump 60 to the high-temperature heat sink 64 by conduction. According to the reverse order of the ideal Carnot vapor cycle, the thermodynamic cycle of the heat pump 60 is characterized by four processes: (1) compression, (2) high-temperature heat-rejection, (3) expansion and (4) low-temperature heat absorption. As with the heat engine 42, the first membrane 18 of the heat pump 60 completes one full oscillation during the cycle.

At the beginning of the first process, compression, the volume of the heat pump cavity is at its point of greatest volume, and the first membrane 18 is at its point of maximum outward deflection. Compression is accomplished by closing an electrical switch (not shown) connected to the top and bottom electrodes 28 and 36 (FIG. 1A) to generate a voltage across the piezoelectric layer 34 (FIG. 1A). When the voltage is applied, the piezoelectric layer 34 functions as an actuator, causing the first membrane 18 to flex downwardly toward the second membrane 16 and thereby compress the vapor 22. As the overall volume of the working fluid 6 decreases, the pressure of the working fluid 6 increases, which results in a corresponding increase in temperature. At the end of the compression process, the electrical switch is opened whereby the piezoelectric layer 34 becomes a capacitor, storing any charge accumulated on the electrodes during the time the voltage was applied.

During the second process, high-temperature heat-rejection, the high-temperature heat sink 64 is thermally coupled to second membrane 16 via thermal switches 68 to remove thermal energy from the heat pump 60 through conduction. As heat is removed from the heat pump 60, some of the vapor 22 condenses, which causes a decrease in the volume of the working fluid 6. The temperature and pressure of the working fluid 6, however, remain constant because the working fluid is a saturated liquid and vapor mixture. The decrease in the volume of the working fluid 6 allows the first membrane 18 to flex further toward the second membrane 16. Since this process occurs with the electrical switch open, the dipole moment of the piezoelectric layer 34, and thus the open-circuit voltage of the electrodes 28 and 36, decrease as the first membrane 18 flexes inward.

The third process, expansion, begins with the working fluid 6 being compressed to its smallest possible volume and the first membrane 18 at its point of maximum inward deflection. To commence the expansion process, the electrical switch is closed to allow for the removal of the electric charge stored in the electrodes 28 and 36. As charge is drained from the electrodes 28 and 36, the modulus of elasticity and the resulting strain of the piezoelectric layer 34 decreases from a higher open-circuit value to a lower closed-circuit value. Accordingly, the piezoelectric layer 34 relaxes, which allows the first membrane 18 to flex upwardly under the pressure of the working fluid 6. The working fluid 6 thus expands as pressure and temperature decrease until the first membrane 18 reaches its neutral point, or point of zero deflection.

Unlike conventional large-scale heat pumps, e.g., vapor compression and adsorption machines, which utilize a throttling valve to expand the working fluid in an isenthalpic process, without producing any work, the micro-heat pump 60 produces work during the expansion process in the form of an electric current flowing from the electrodes 28, 36. By extracting work, the micro-heat pump 60 provides for the expansion of the working fluid 6 in a substantially isentropic process, which is significant for two reasons. First, the extraction of work in an isentropic process causes the internal energy and the temperature of the working fluid 6 to drop more than in an isenthapic throttling process. As such, more cooling will result. Second, the efficiency of the cycle can be increased if the electric current generated during the expansion is used to offset the power required to compress the working fluid 6 in the first process.

During the fourth process, low-temperature heat absorption, the low-temperature heat source 62 is thermally coupled to the first membrane 18 via thermal switches 66 to transfer thermal energy to the heat pump 60 through conduction. As heat moves into the working fluid 6, some of the liquid portion 23 of the working fluid vaporizes, thereby increasing the volume the working fluid 6. This causes an upward displacement of the first membrane 18 and a current to flow from the electrodes 28 and 36. As in the heat-rejection process (process two), the temperature and pressure remain constant because the working fluid 6 is a saturated liquid and vapor mixture. Following the heat-absorption process, the thermodynamic cycle then repeats itself, starting again with the compression process.

As with the heat engine 42 of the present invention, the heat pump 60 integrates all heat-pump functions into a self-contained cell-like structure. Also, similar to the system of cascading heat engines 42 of FIG. 5, multiple heat pumps 60 may be arranged in a similar by configured system of cascading levels in order to increase the rate of cooling and the temperature differential over the rate and differential obtainable using only a single heat pump. As an example, if a single heat pump 60 cools a cold space by 10° C., then ten similar heat pumps 60 stacked in a cascade array may cool the lowermost cold space of the cascade by 100° C. In addition, if a single heat pump 60 transfers 0.1 Watt of thermal power out of a cold space, then ten heat pumps 60 deployed in parallel may transfer 1.0 Watt of thermal power out of the same cold space.

The dimensions suggested for the heat engine 42 may also be used for the heat pump 60. Again, to ensure that there is adequate heat-transfer area through the heat pump, the dimensions desirably provide for a low aspect ratio.

Fabrication Methods for the Micro-Heat Engine and Micro-Heat Pump

Figure 4:
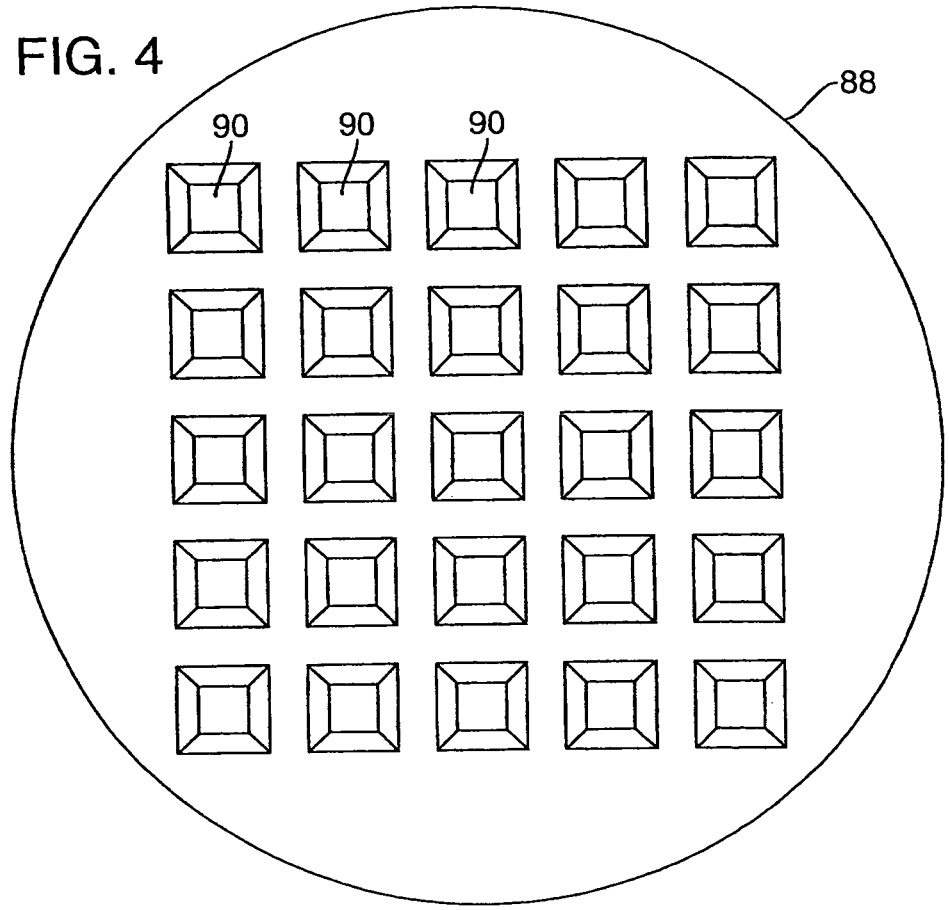
FIG. 4 is a top plan view of the backside of a first wafer of a pair of wafers used for constructing an array of piezoelectric micro-transducers, wherein the first wafer defines a plurality of square pits therein for forming the first membranes of the array of micro-transducers.

Using conventional micro-manufacturing techniques, an array of micro-transducers can be constructed from a pair of silicon wafers. Referring to FIG. 4, a first wafer 88 of a pair of silicon wafers each being in the (001) crystaline orientation and polished on both sides is provided to form the first membranes 18 of an array of micro-transducers 10. First, thermal oxide is grown on both sides of the wafer 88. Then, a pattern of squares each oriented in the <100> direction is defined, for example, using conventional lithography on the backside of the first wafer. The oxide is then removed via wet chemical etching and the first wafer 88 is placed in an anisotropic etchant, such as ethylene diamene pyrochatecol (EDP), which preferentially removes silicon on a {001} plane compared to a {111} plane. Etching causes a plurality of pits 90 to be defined where the oxide had been removed. The first wafer 88 is removed from the etchant when approximately 50 microns of silicon remains at the bottom of each pit 90. A layer of 20-nm thick titanium is then deposited on the non-etched oxide side using physical vapor deposition, and a layer of 200-nm thick platinum is then grown over the layer of titanium using physical vapor deposition. The titanium and platinum layers will form the top electrode 28 of each transducer 10 formed in the wafers.

To form the piezoelectric layer 34 for each micro-transducer 10, a solution deposition route for PZT deposition is carried out on the first wafer 88. First, a solution containing the stoichiometric ratio of Pb, Zr, and Ti required for forming the Perovskite phase is spin-coated onto the layer of platinum. The first wafer 88 is then heated in air to 100° C. for 5 minutes and to 350° C. for 5 minutes. The spin-coating and heating process is then be repeated until the PZT layer is about 500-nm, after which the first wafer 88 is heated in a furnace to 700° C. for 15 minutes. The steps of spin-coating and heating the wafer 88 in air to 100° C. for 5 minutes and to 350° C. for 5 minutes is repeated until the final thickness of the piezoelectric layer 34 is achieved, which desirably is about 500-nm. Once the final thickness of the piezoelectric layer 34 is achieved, the first wafer 88 is again heated in a furnace to 700° C. for 15 minutes.

To form the bottom electrodes 36 of the micro-transducers 10, a 200-nm thick layer of gold is deposited on the PZT surface via physical vapor deposition. The first wafer 88 is then placed into another anisotropic etchant in which the remaining 50 microns of silicon at the bottom of each pit 90 are removed until the desired layer thickness of silicon remains (e.g., between 1 and 10 microns).

To form the second membranes 16 of the micro-transducers 10, an array of square pits is machined on the back side of a second wafer (not shown), wherein the array on the second wafer corresponds to the array of pits 90 on the first wafer 88. Machining is continued on the second wafer until approximately 30 microns of silicon remains at the bottom of each pit. To form the side walls 20 of the fluid cavities 8, a layer of photo-resist material such SU-8 is spin-coated on the front side of the second wafer. The cavity thickness of each micro-transducer 10, preferably about 50 microns, is defined by the thickness of the photo-resist layer added to the second wafer. Photo-lithography is then used to define a pattern of squares on the photo-resist material equal in foot print to the squares defining the first membranes 18 and the second membranes 16. The unmasked portions of the photo-resist layer are etched to a depth of 50 microns to form the fluid cavities 8. After the cavities 8 are defined, a small amount of working fluid is added to each cavity using, e.g., a syringe dispenser. The first wafer 88 is then brought face down into contact with the SU-8 photo-resist deposited on the front side of the second wafer, with the square cavities on both wafers being in alignment with each other. Finally, the first and second wafers are secured together to form an array of identical micro-transducers. If desired, the individual transducers may be separated from the wafers for applications having power or cooling requirements that can be met using only a few transducers.

Kinetic Piezoelectric Micro-Transducer

Figure 6:
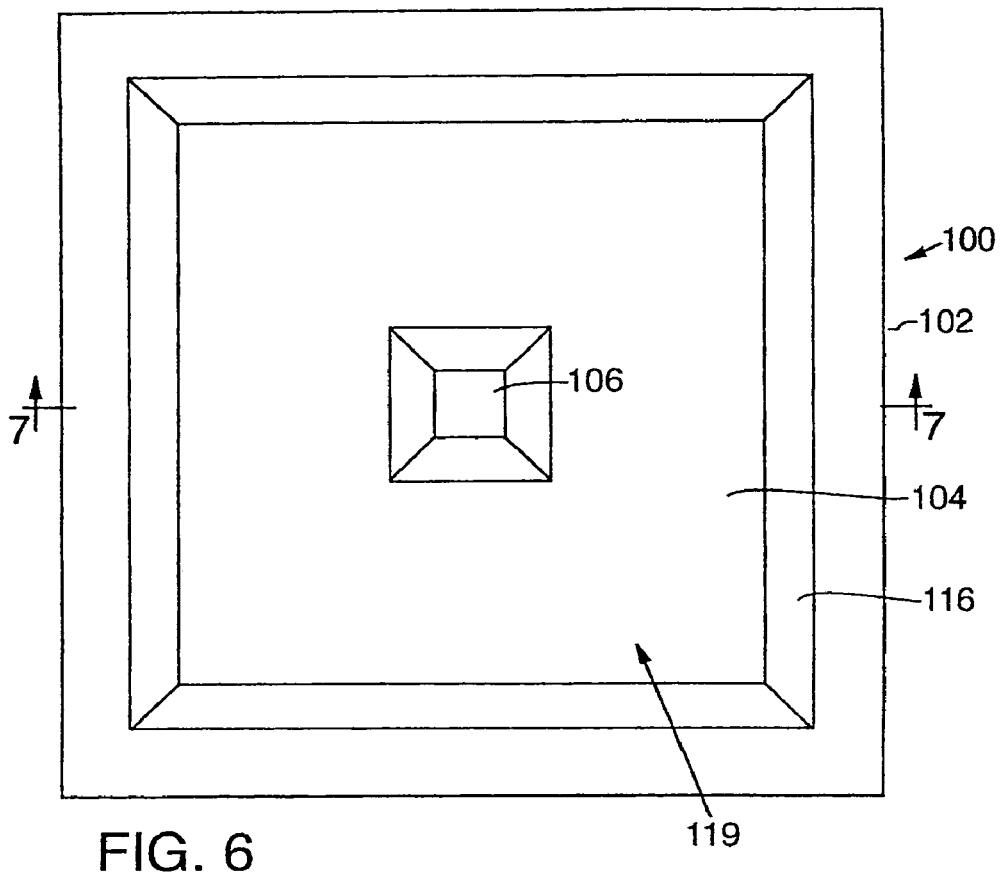
FIG. 6 is a top plan view of a flexible membrane-type piezoelectric micro-transducer according to another embodiment.
Figure 7:
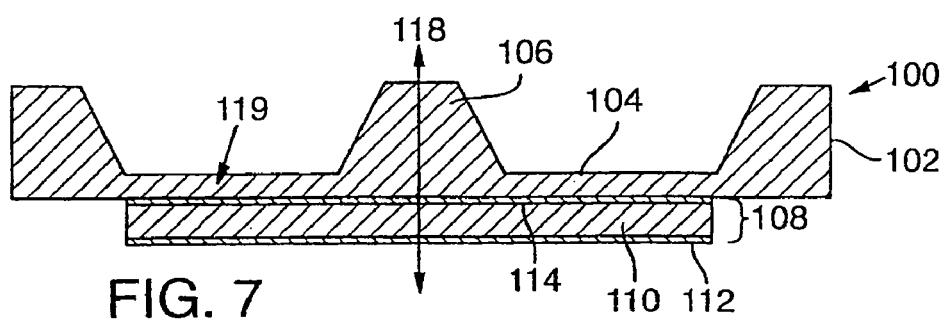
FIG. 7 is a cross-sectional view of the micro-transducer of FIG. 6, taken along line 7-7 of FIG. 6.

According to another aspect of the invention, a piezoelectric micro-transducer can be used to harvest kinetic energy from a moving body and to convert the kinetic energy into useful electrical energy. FIGS. 6 and 7 show a micro-transducer 100 according to one embodiment for converting kinetic energy from a moving body into useful electrical energy. The micro-transducer 100 includes a body 102, which comprises silicon or other equivalent material. As shown in FIG. 6, the body 102 has a square shape, although it may rectangular, circular, or any of other various shapes. A recess is defined in the body 102 to form a flexible support layer 104 surrounded by a peripheral portion 116 of the body 102. The body 102 may include a centrally located mass 106 that serves to decrease the resonant mechanical frequency of the micro-transducer 100, the significance of which is explained in greater detail below. As shown in FIG. 7, a piezoelectric unit 108 is carried by, or otherwise mounted to, the support layer 104. The piezoelectric unit 108 comprises a piezoelectric layer 110 disposed between a first electrode 112 and a second electrode 114.

The support layer 104 and piezoelectric unit 108 together define a flexible membrane 119, with the peripheral portion 116 of the body 102 serving as a support structure for supporting the flexible membrane 119. The flexible membrane 119 is deflectable upwardly and downwardly relative to the peripheral portion 116 (as indicated by double-headed arrow 118 in FIG. 7). In an alternative configuration, the flexible membrane 119 does not include a support layer; the piezoelectric unit is instead coupled to an adjacent support structure.

In either case, whenever the micro-transducer 100 is placed on a moving body (not shown), the oscillations of the body cause the flexible membrane 1 19 to deflect upwardly and downwardly. The applied strain on the piezoelectric layer 104 produces a voltage across the piezoelectric unit 108. Electrical leads (not shown) are connected to the first and second electrodes 112 and 114 to conduct electric charge generated by the piezoelectric unit 108. The electric charge may be used, for example, to power a MEMS device or to recharge a battery. In this manner, the micro-transducer 100 functions as a piezoelectric generator in converting the kinetic energy of the moving body into useful electrical energy.

In one application, for example, the micro-transducer 100 is mounted to a vehicle. The vibrations of the vehicle (e.g., the vibration of the engine of the vehicle) causes deflection of the flexible membrane 119 of the micro-transducer 100 for producing electrical energy. In another application, the micro-transducer 100 is incorporated into a portable electrical device, such as a portable radio carried by a jogger or walker. In this application, the movement of the person carrying the radio causes vibration of the micro-transducer 100 for producing electrical energy, which can be used to power the radio or to recharge its batteries.

Desirably, the micro-transducer 100 is configured to have a mechanical resonant frequency equal to the frequency of oscillation of the moving body to maximize displacement of the flexible membrane 119 and thereby maximize the voltage produced by the piezoelectric unit. Thus, the resonant frequency of the micro-transducer 100 will vary depending up on the frequency of oscillation of the body on which the micro-transducer 100 is mounted. Achieving a resonant frequency of the micro-transducer 100 that matches the frequency of the moving body can be accomplished by varying a dimension of a component of the flexible membrane 119 (i.e., either the support layer 104, the piezoelectric layer 110, the first electrode 112, or the second electrode 114) by, for example, varying the length, width, or thickness of a component of the flexible membrane 119 or by varying the size of the mass 106. Increasing the length, width, or thickness of the flexible membrane 119 or increasing the size of the mass 106 will result in a corresponding decrease in the resonant frequency. Conversely, decreasing the length, width, or thickness of the flexible membrane 119 or decreasing the size of the mass 106 will result in a corresponding increase in the resonant frequency.

In applications in which the frequency of the moving body is relatively low, e.g., in a range of about 1 to 1000 Hz, the resonant frequency of the micro-transducer may have to be decreased significantly to match the frequency of the moving body. Thus, placing a mass on the flexible membrane 119, such as the mass 106 in FIGS. 6 and 7, is advantageous in that lower resonant frequencies can be achieved without unduly increasing the overall size of the micro-transducer 100. Moreover, by varying the size of the mass 106 to vary the resonant frequency, a standard-sized micro-transducer 100 can be produced for use in most applications.

The dimensions of the micro-transducer 100 may vary. The length of the membrane 119 of the micro-transducer 100 desirably is about 1 to 5 mm. If the micro-transducer 100 is circular in shape, then the diameter of the membrane desirably is about 1 to 5 mm. The thickness of the piezoelectric layer 110 desirably is about 0.5 to 30 microns. The thickness of each of the first and second electrodes 112, 114, desirably is less than 1 micron. The thickness of the support layer 104 may range from about 0.5 microns to about 30 microns but desirably is less than the thickness of the piezoelectric layer 110 which it supports.

FIGS. 8 and 9 show a cantilever-type micro-transducer 120 according to another embodiment for converting kinetic energy from a moving body into useful electrical energy. The micro-transducer 120 comprises a body 122, which comprises any suitable material, such as silicon. A recess is formed in the body 122 to form a flexible support layer 124 surrounded by a peripheral portion 126 of the body 102 (as best shown in FIG. 9), which serves as a support structure for the support layer. The support layer 124 is separated from the peripheral portion 126 by a gap 128 except at one end thereof so that a free end 140 of the support layer 124 can deflect upwardly and downwardly relative to the peripheral portion 126. The support layer 124 and a piezoelectric unit 130 carried by the support layer 124 together define a flexible cantilever 142. In an alternative configuration, a support layer for the piezoelectric unit 130 is not provided and the fixed end of the piezoelectric unit 130 (i.e., the end opposite the free end 140) is coupled to an adjacent support structure.

The piezoelectric unit 130, like the piezoelectric unit 108 of FIG. 7, comprises a piezoelectric layer 132 disposed between a first electrode 134 and a second electrode 136. A mass 138 may be disposed proximate the free end of the flexible cantilever 142 to decrease or otherwise, change the resonant frequency of the micro-transducer 120. In the illustrated embodiment, for example, the mass 138 is integral with and comprises the same material as the support layer 124.

The micro-transducer 120 of FIGS. 8 and 9 functions in a manner that is similar to the micro-transducer 100 of FIGS. 6 and 7. Thus, when the micro-transducer 120 is placed on a moving body, the vibrations or oscillations of the moving body causes the free end 140 of the cantilever 142 to deflect upwardly and downwardly relative to the peripheral portion 126, thereby generating a voltage across the piezoelectric unit 130.

The dimensions of the micro-transducer 120 may vary. The length of the cantilever 142 desirably is about 1 to 5 mm and the width of the cantilever 142 desirably is about 10 to 100 microns. The thickness of the piezoelectric layer 132 desirably is about 0.5 to 30 microns. The thickness of each of the first and second electrodes 134, 136, desirably is less than 1 micron. The thickness of the support layer 124 may range from about 0.5 microns to about 30 microns but desirably is less than the thickness of the piezoelectric layer 132 supported by the support layer 124.

The energy requirements for most applications of the micro-transducers will require more electrical energy than can be provided by a single micro-transducer. Accordingly, in another embodiment, a plurality of like micro-transducers, having the same general configuration of the micro-transducer 100 of FIGS. 6 and 7 or the micro-transducer 120 of FIGS. 8 and 9, are formed on a single substrate. In yet another embodiment, an apparatus for generating electrical energy comprises multiple substrates, each having a plurality of micro-transducers formed thereon, stacked on top of each other.

The micro-transducer 100 of FIGS. 6 and 7 and the micro-transducer 120 of FIGS. 8 and 9 can also be used to extract mechanical work from a flowing stream of fluid. Referring to FIG. 10, there is shown a cantilever-type micro-transducer 150 that has a similar construction to the micro-transducer 120 of FIGS. 8 and 9, except that the micro-transducer 150 of FIG. 10 has a flexible cantilever 152 that is pre-stressed. As shown, the pre-stress causes the cantilever 152 to curve downwardly, away from the horizontal plane defined by the body 122 of the micro-transducer 150. The flexible cantilever 152 can be pre-stressed, for example, by adding a layer in tension to the top of the flexible cantilever 152 or by adding a layer in compression to the bottom of the flexible cantilever 152. The pre-stressed layer, either in tension or compression, can be an existing layer of the flexible cantilever or an additional layer (not shown) that is added to the top or bottom of the flexible cantilever 152. Such an additional layer may comprise, for example, a tungsten film deposited via physical vapor deposition. The deposition pressure during sputtering may be varied to achieve a desired level of stress.

A fluid channel 154 is defined between a first barrier member 156 spaced from the bottom of the micro-transducer 150 and a second barrier member 158 positioned on top of the micro-transducer 150. A pressurized fluid 164 flows through the fluid channel 154 in a direction indicated by arrow 160 so that the pressurized 164 fluid impinges the lower surface of the cantilever 152 to deflect the cantilever 152 upward. Because the cantilever 152 is substantially non-parallel to the direction 160 of fluid flow, deflection of the cantilever 152 by the pressurized fluid 164 is maximized. Interrupting the flow of the pressurized fluid 164 allows the cantilever 152 to return to its pre-flexed position. Thus, to cause the cantilever 152 to continuously flex upwardly and downwardly for producing a voltage across the piezoelectric unit 130, as indicated by double-headed arrow 162, the pressurized fluid may be pulsed, for example, by opening and closing a valve upstream of the micro-transducer 150. Desirably, the fluid is pulsed at a frequency that is equal to the resonant frequency of the micro-transducer 150 to maximize the electrical energy produced by the micro-transducer 150.

In an alternative embodiment, the cantilever 152 is not pre-stressed as shown in FIG. 10. Consequently, in the alternative embodiment, the cantilever 152 is substantially parallel to the direction of the fluid flow. However, this configuration is less desirable because the extent of the displacement of the cantilever caused by the pressurized fluid will be less than the displacement of the cantilever 152 of FIG. 10. In yet another alternative embodiment, a membrane-type micro-transducer, such as shown in FIGS. 6 and 7, is used instead of the cantilever-type micro-transducer 150 in the embodiment of FIG. 10. The membrane may be pre-stressed to curve the membrane in a direction that is substantially non-parallel to the direction of fluid flow. In this configuration, adding a pre-stressed layer to the membrane would cause the central portion of the membrane to distend outwardly from the peripheral portion of the micro-transducer surrounding the membrane.

Figure 11:
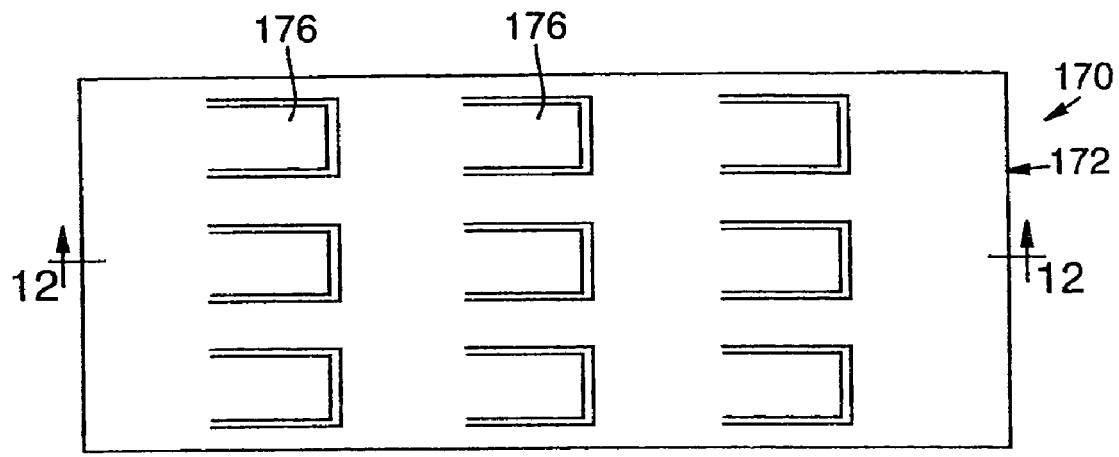
FIG. 11 is a top plan view of an apparatus according to another embodiment for converting kinetic energy from a pressurized stream of fluid into electrical energy, wherein the top barrier member of the apparatus is removed to show a first substrate having a plurality of pre-stressed cantilever-type piezoelectric micro-transducers formed therein.
Figure 12:
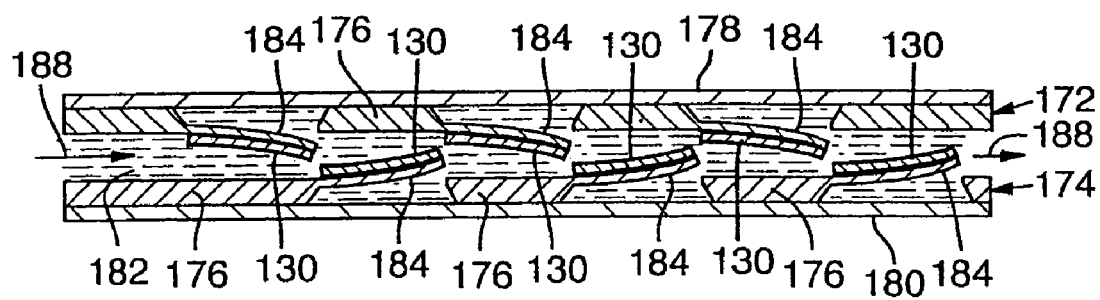
FIG. 12 is a cross-sectional view of the apparatus of FIG. 11 taken along line 12-12 of FIG. 11.

FIGS. 11 and 12 show an apparatus 170 comprising a plurality of cantilever-type micro-transducers 176 each having the same general construction as the micro-transducer 150 shown in FIG. 10. The apparatus 170 comprises a first substrate 172 spaced from a second substrate 174, each of which includes an array micro-transducers 176 formed therein. As shown in FIG. 12, a first barrier member 178 is juxtaposed to the first substrate 172 and a second barrier member 180 is juxtaposed to the second substrate 174 so as to define a fluid passageway 182 between the first and second substrates 172, 174, respectively. The cantilever 184 of each micro-transducer 176 is pre-stressed so to curl away from the plane of the respective substrate 172, 174 into the fluid passageway 182. A pulsating, pressurized fluid flows through the fluid passageway 182 in the direction indicated by arrows 188. As a fluid pulse travels through the fluid passageway 182, the pulse impinges the cantilever 184 of a micro-transducer 176 and is redirected toward another cantilever of a downstream micro-transducer on an opposing substrate. In this manner, the fluid pulse moves through the fluid passageway 182, alternately exciting cantilevers on the first and second substrates 172, 174, respectively. Continuous pulsations of the pressurized fluid traveling through the fluid passageway 182 cause the cantilevers 184 to oscillate, thereby producing a voltage across their respective piezoelectric units 130.

Referring now to FIG. 13A, there is shown a micro-transducer 200 that is configured to freely vibrate or oscillate whenever a steady-state fluid flows across the surface of the micro-transducer, much like a freely-vibrating reed found in a conventional harmonica or similar reed instruments. The micro-transducer 200 in the form shown comprises a first major layer 202, in which there is formed a flexible cantilever 204. A piezoelectric unit 206 is mounted to the lower surface of the cantilever 204. A second major layer 208 is juxtaposed to the lower surface of the first major layer 202 and a first barrier member 210 is juxtaposed to the lower surface of the second major layer 208. A lower fluid chamber 214 is defined by an aperture 212 formed in the second major layer 208, the lower surface of the first major layer 202 and the piezoelectric unit 206, and the upper surface of the first barrier member 210. The lower fluid chamber 214 includes a fluid inlet 224. A second barrier member 216 is juxtaposed to the upper surface of first major layer 202. An upper fluid chamber 216 is defined between the second barrier member 216 and the upper surface of the cantilever 204. A fluid outlet 222 of the upper fluid chamber is defined between a recess portion 220 of the second barrier member 216 and the first major layer 202.

When the cantilever 204 is in its neutral position, such as shown in FIG. 13A, the free end of the cantilever 204 is closest to a vertical surface 226 of the first major layer 202 so as to effectively fluidly disconnect the lower fluid chamber 214 from the upper fluid chamber 218. As shown in FIG. 13B, a steady-state fluid introduced into the lower fluid chamber 214 through the fluid inlet 224 causes the free end of the cantilever 204 to initially flex upwardly toward the second barrier member 216 to permit the fluid to flow into the upper fluid chamber 218, as indicated by arrow 228. The spring energy of the cantilever 204 then causes the cantilever 204 to flex downwardly through its neutral position, at which point fluid flow to the upper chamber 218 is temporarily interrupted. As the cantilever 204 continues to flex downwardly beyond its neutral position, as shown in FIG. 13C, fluid is again permitted to flow into the upper fluid chamber 218, as indicated by arrow 228. In this manner, the cantilever 204 oscillates continuously between the upwardly deflected position shown in FIG. 13B and the downwardly deflected position shown in FIG. 13C, converting the kinetic energy of the fluid into electrical energy.

Figure 14:
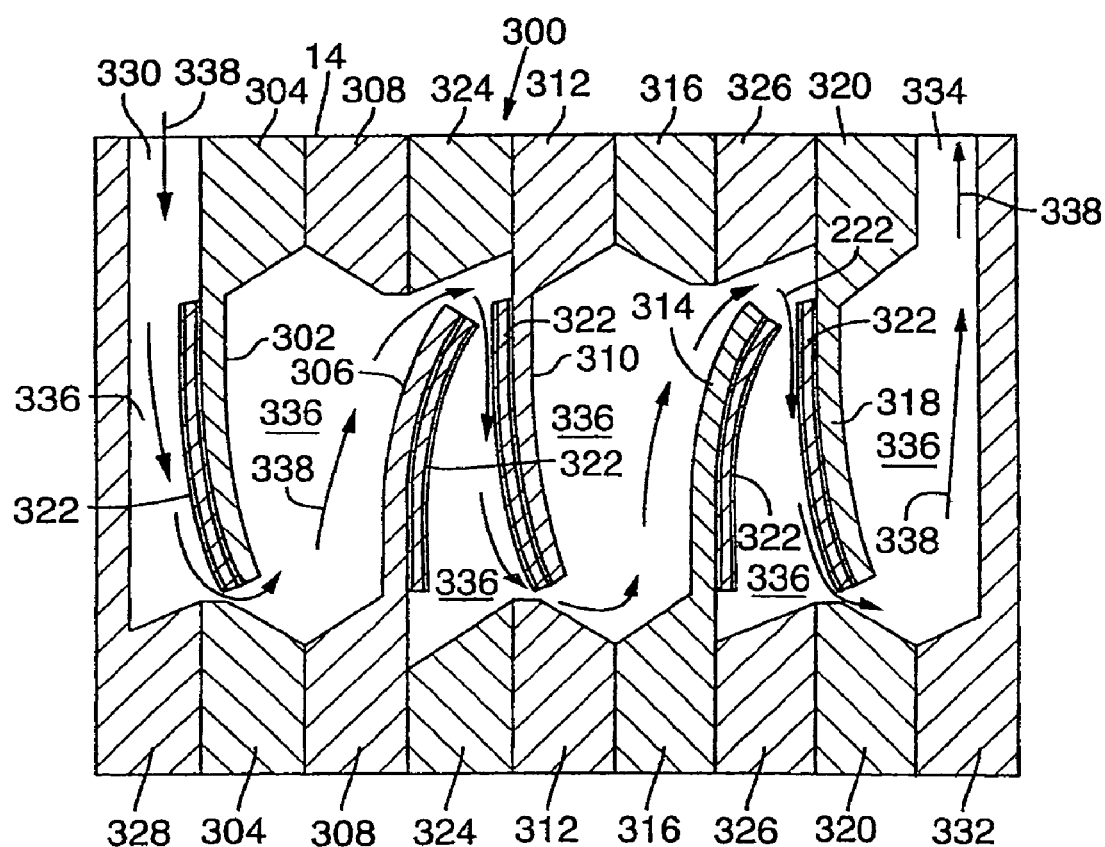
FIG. 14 is a cross-sectional view of an apparatus according to another embodiment comprising a plurality of piezoelectric micro-transducers having the same general construction of the micro-transducer of FIGS. 13A-13C.

Referring to FIG. 14, an apparatus 300 comprises a plurality of free-vibrating cantilevers arranged in series. As shown, a first cantilever 302 is formed in a first layer 304; a second cantilever 306 is formed in a second layer 308; a third cantilever 310 is formed in a third layer 312; a fourth cantilever 314 is formed in a fourth layer 316; and a fifth cantilever 318 is formed in a fifth layer 320. A piezoelectric unit 322 is mounted on each cantilever 302, 306, 310, 314, and 318. A spacer layer 324 is interposed between the second layer 308 and the third layer 312 and a spacer layer 326 is interposed between the fourth layer 316 and the fifth layer 320. A first end layer 328 positioned adjacent the first layer defines a fluid inlet 330, and a second end layer 332 positioned adjacent the fifth layer defines a fluid outlet 334. A plurality of fluid chambers 336 are defined between each layer of the apparatus 300. As a steady-state fluid flows through the fluid chambers 336 in the direction indicated by arrows 338, the cantilevers 302, 306, 310, 314, and 318 oscillate continuously between a first position wherein the cantilevers are displaced from their respective neutral positions in a first direction and a second position wherein the cantilevers are displaced from their respective neutral positions in a second direction.

Micro-Internal Combustion Engine

Figure 15A:
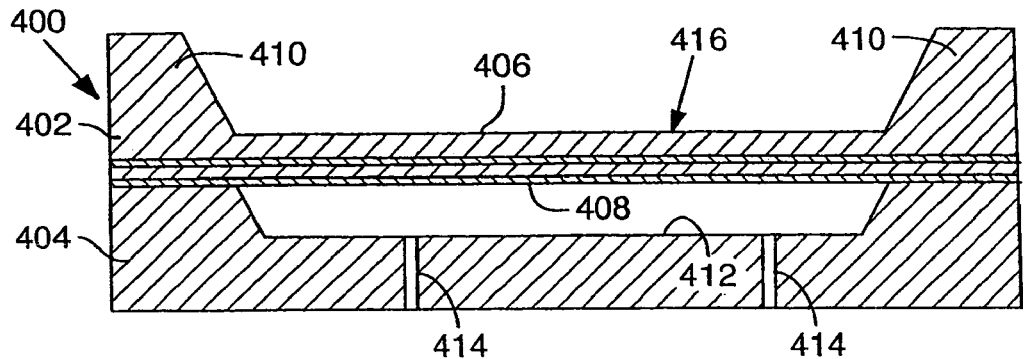
FIGS. 15A-15C are cross-sectional views of a piezoelectric micro-transducer according to still another embodiment configured for use as a micro-internal combustion engine.

According to yet another aspect of the invention, a piezoelectric micro-transducer operates in a manner that is similar to that of an internal combustion engine by extracting mechanical work of periodic pressure pulses produced by the periodic combustion of a fuel and an oxidizer. Referring to FIG. 15A, there is shown a micro-transducer 400 comprising a first major layer 402 and a second major layer 404. A recess in the first major layer 402 forms a support layer 406 surrounded by a peripheral portion 410. The support layer 406 supports a piezoelectric unit 408, which collectively form a flexible membrane 416. In this configuration, the piezoelectric unit 408 is shown as extending continuously between the outer side walls of the peripheral portion 410. In other embodiments, the piezoelectric layer 408 may extend between the inner walls of the peripheral portion 410 (such as shown in FIG. 7).

A fluid cavity 412 is defined between the lower surface of the piezoelectric unit 308 and a recess formed in the adjacent surface of the second major layer 404. One or more fluid passageways 414 extend through the second major layer 404 to permit a mixture of a fuel and an oxidizer (e.g., air) to fill the fluid cavity 412. Generally, any volatile, lightweight fuels can be used. Examples of such fuels include, without limitation, butane, propane, ethanol, methanol, and the like.

Figure 15B:
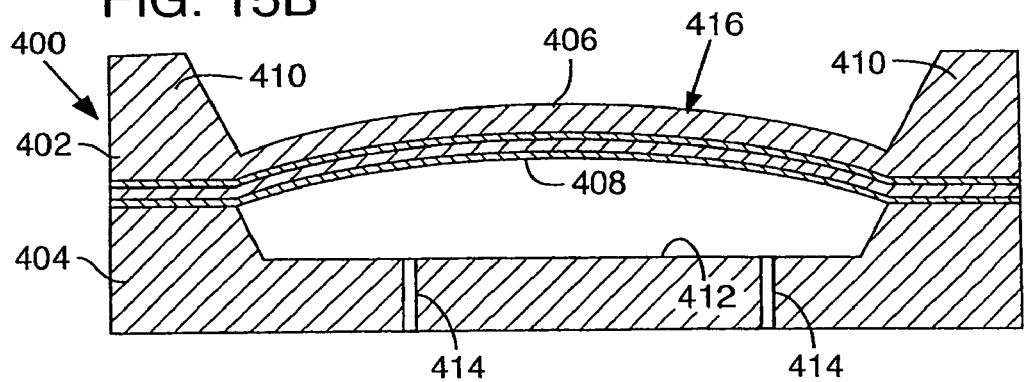
Figure 15C:
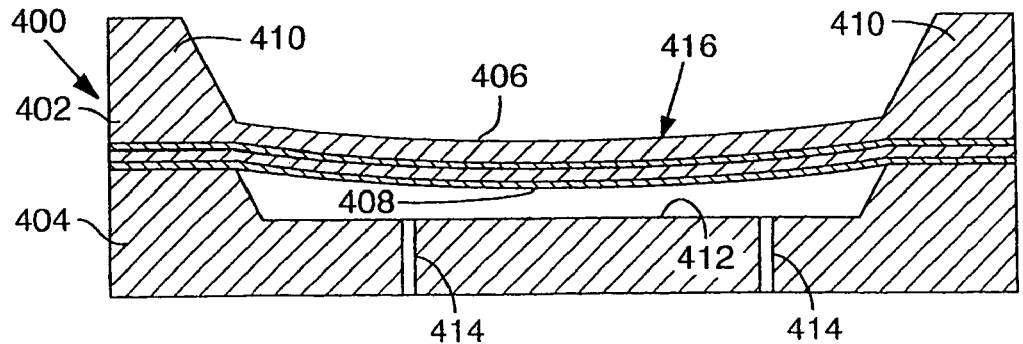

Combustion of the fuel and oxidizer mixture in the fluid cavity 412 causes the flexible membrane 416 to flex outwardly away from the second layer 404 (as shown in FIG. 15B). Spring energy in the flexible membrane 416 then urges the flexible membrane 416 to flex inwardly toward the second layer 404 (as shown in FIG. 15C). By producing periodic pressure pulses in the fluid cavity 412 through the combustion of fuel and oxidizer in the fluid cavity 412, the flexible membrane 416 is caused to oscillate between the outwardly deflected position shown in FIG. 15B and the inwardly deflected position shown in FIG. 15C, thereby creating a voltage across the piezoelectric unit 408.

FIGS. 16A and 16B illustrate a micro-transducer 500 according to another embodiment that is configured to be used as a micro-internal combustion engine. The micro-transducer 500 includes a first major layer 502. A piezoelectric cantilever 503 comprises a cantilevered support layer 506 formed in the first major layer 502 and a piezoelectric unit 508 coupled to the support layer 506. A first barrier member 510 overlays the first major layer 502 so as to define an upper fluid chamber 512 between the support layer 506 and the first barrier member 510. A second major layer 504 defining an aperture 514 is positioned adjacent the lower surface of the first major layer 502. A second barrier member 516 is positioned adjacent the lower surface of the second major layer 504 to define a lower fluid chamber 518 having a fluid inlet 520.

During operation, a fuel and oxidizer mixture flowing from the lower fluid chamber 518 into the upper fluid chamber 512 causes the piezoelectric cantilever 503 to flex upwardly, temporarily trapping the fuel and oxidizer mixture in the upper fluid chamber 512. The fuel and oxidizer mixture is then ignited, thereby creating a pressure pulse that urges the piezoelectric cantilever 503 to flex downwardly.

Micro-Rankine Cycle Heat Engine

According to another aspect of the invention, one or more piezoelectric micro-transducers are employed to extract work from a working fluid to provide useable electrical energy in a manner that is similar to a conventional large-scale Rankine cycle heat engine. FIG. 18 is a schematic illustration of a micro-Rankine cycle heat engine, indicated generally at 600, according to one embodiment. Conventional large-scale engines based on the Rankine cycle employ a working fluid for producing mechanical work and a fuel for heating the working fluid. For example, in a conventional steam engine, a fossil fuel, such as coal, is burned to heat the working fluid, i.e., steam. In the present embodiment, however, a single fluid can serve as both the working fluid and the fuel of the heat engine 600. The working fluid/fuel desirably comprises a fluid that is volatile, lightweight and has a low vapor pressure. Examples of such fluids include, without limitation, butane, propane, ethanol, methanol, and the like.

The heat engine 600 includes a reservoir 602 for storing working fluid/fuel, a boiler 604, a first superheater 606, a first expander array 608, a second superheater 610, a second expander array 612, a third superheater 614, a third expander array 616, a fourth superheater 618, a fourth expander array 620, at least one combustor 622. Each of the expander arrays 608, 612, 616, 620 in the present embodiment comprises one or more piezoelectric micro-transducers having free-vibrating cantilevers, such as the apparatus 300 of FIG. 14.

At the beginning of the cycle, working fluid/fuel flows from the reservoir 602 into the boiler 604, in which the working fluid/fuel is heated until to a saturated vapor. The saturated vapor flows from the boiler 602 into the first superheater 606, in which the vapor is further heated to a superheated condition.

Downstream of the first superheater 606, the superheated vapor flows into the first expander array 608. The first expander array 608 comprises one or more piezoelectric micro-transducers 624. Each micro-transducer 624 includes a free-vibrating cantilever 626 on which a piezoelectric unit (not shown, but discussed at length above) is mounted. Thus, as the superheated vapor flows through the first expander array 608, the cantilevers 626 flex back and forth in the fluid stream, generating a voltage across their respective piezoelectric units. Because the superheated vapor of the working fluid/fuel expands as it flows through the first expander array 608, the temperature of the vapor drops from its superheated temperature. The working fluid/fuel is then re-heated to its superheated temperature in the second superheater 610, after which the superheated vapor is again expanded as it flows through the second array of expanders 612. This expansion and re-heat process is repeated two more times as the vapor flows through the third superheater 614, the third expander array 616, the fourth superheater 618 and the fourth expander array 620.

Although the embodiment of FIG. 18 is shown as having four superheaters and four expander arrays, more or fewer superheaters and expanders may be used. Desirably, the working fluid/fuel is re-heated and expanded over and over until the pressure drop in the working fluid/fuel makes further re-heat and expansion impractical or impossible.

In any event, after the working fluid/fuel leaves the fourth expander array 620, the working fluid/fuel flows into the array of combustors 622, at which point the working fluid/fuel can be used as a fuel. At each combustor 622, the working fluid/fuel is mixed with an oxidizer (e.g., air) and ignited to heat either the boiler 604 or one of the superheaters 606, 610, 614 or 618.

Because of the large ratio of surface area to volume of the working fluid/fuel that is available on the micro-scale, expansion and re-heat can occur simultaneously. For example, an expander array can be configured so that working fluid/fuel flowing through the expander is simultaneously heated by working fluid/fuel being burned in an adjacent combustor.

Other forms for the expander arrays 608, 612, 616 and 620 also may be used. For example, the apparatus 170 of FIGS. 11 and 12 may be used for each of the expander arrays. In this configuration, a valve can be positioned upstream of each expander array to produce pressure pulses in the working fluid/fuel.

The present invention has been shown in the described embodiments for illustrative purposes only. The present invention may be subject to many modifications and changes without departing from the spirit or essential characteristics thereof. We therefore claim as our invention all such modifications as come within the spirit and scope of the following claims.

We claim:

1. A method of generating electrical energy with a micro-transducer having a chamber containing fluid, wherein a surface of the chamber comprises a piezoelectric generator, the method comprising:
    transferring heat into the micro-transducer to expand the fluid and cause the piezoelectric generator to distend outwardly from the chamber, thereby causing the piezoelectric generator to generate electrical energy.

2. The method of claim 1 wherein the fluid comprises a saturated vapor and liquid.

3. The method of claim 2 wherein the chamber is configured such that at least a portion of the liquid adheres to inside surfaces of the chamber due to surface tension of the liquid, thereby resulting in separation of the liquid from the vapor.

4. The method of claim 1 wherein the fluid is sealed in the chamber, and heat energy is flowed through the micro-transducer between a high-temperature heat source and a low-temperature heat sink to cause the fluid to expand.

5. The method of claim 4 wherein:
    transferring heat into the micro-transducer from the high-temperature heat source comprises transferring heat into the micro-transducer from the high-temperature heat source via a first thermal switch contacting the micro-transducer and the high-temperature heat source; and
    transferring heat from the micro-transducer to the low-temperature heat sink comprises transferring heat from the micro-transducer to the low-temperature heat sink via a second thermal switch contacting the micro-transducer and the high-temperature heat sink.

6. The method of claim 4, further comprising the steps of transferring heat into the micro-transducer from the high-temperature heat sink through conduction, and transferring heat from the micro-transducer to the low-temperature heat sink through conduction.

7. The method of claim 4 wherein:
the piezoelectric generator is deflectable between an outwardly deflected position and an inwardly deflected position,
heat flowing into the micro-transducer causes the piezoelectric generator to deflect to the outwardly deflected position, and
heat flowing out of the micro-transducer causes the piezoelectric generator to deflect to the inwardly deflected position.

8. The method of claim 7 wherein electrical energy is removed from the piezoelectric generator at the outwardly deflected position, the inwardly deflected position, and at a neutral, non-deflected position intermediate the outwardly deflected position and the inwardly deflected position.

9. The method of claim 1, further comprising generating electrical energy with a plurality of micro-transducers arranged in a stacked configuration, wherein heat rejected by a micro-transducer is transferred into an adjacent micro-transducer.

10. The method of claim 1 wherein the fluid comprises a fuel, the method further comprising introducing a first mixture of the fuel and an oxidizer into the chamber, wherein expanding the fluid comprises combusting the first mixture of the fuel and the oxidizer to distend the piezoelectric generator.

11. The method of claim 10, further comprising introducing a second mixture of the fuel and the oxidizer into the chamber and combusting the second mixture of the fuel and the oxidizer.

12. A method of generating electrical energy with a first set of at least one micro-transducer and a second set of at least one micro-transducer, each micro-transducer comprising a deflectable generator at least partially bounding a fluid-tight cavity containing a respective fluid, the method comprising:
transferring heat into the at least one micro-transducer of the first set to expand the fluid of the micro-transducer and cause the respective generator to deflect outwardly from the respective cavity, thereby causing the respective generator to generate electrical energy; and
transferring heat from the at least one micro-transducer of the first set to the at least one micro-transducer of the second set to expand the fluid of the micro-transducer of the second set and cause the respective generator to deflect outwardly from the respective cavity, thereby causing the respective generator to generate electrical energy.

13. The method of claim 12 wherein:
the first set of at least one micro-transducer comprises a plurality of micro-transducers; and
the second set of at least one micro-transducer comprises a plurality of micro-transducers, the micro-transducers of the second set being registered with respective micro-transducers of the second set so that heat rejected from the micro-transducers of the first set can flow into the respective micro-transducers of the second set.

14. The method of claim 13 wherein transferring heat from the at least one micro-transducer of the first set to the at least one micro-transducer of the second set comprises alternately thermally coupling the at least one micro-transducer of the first set to the at least one micro-transducer of the second set and removing the micro-transducers from being thermally coupled to each other.

* * * * *